United States Patent
Nagashima et al.

[11] Patent Number: 6,048,800
[45] Date of Patent: *Apr. 11, 2000

[54] PROCESS FOR PLANARIZING SURFACE OF A SEMICONDUCTOR DEVICE

[75] Inventors: Naoki Nagashima; Hiroshi Takahashi, both of Kanagawa, Japan

[73] Assignee: Sony Corporation, Tokyo, Japan

[ * ] Notice: This patent is subject to a terminal disclaimer.

[21] Appl. No.: 08/775,151

[22] Filed: Dec. 31, 1996

Related U.S. Application Data

[63] Continuation of application No. 08/372,942, Jan. 17, 1995, Pat. No. 5,629,242.

[30] Foreign Application Priority Data

Jan. 17, 1994 [JP] Japan ..................................... 6-017940
Oct. 27, 1994 [JP] Japan ..................................... 6-287341

[51] Int. Cl.[7] ................................................... H01L 21/31
[52] U.S. Cl. .......................... 438/761; 438/763; 438/692; 438/633; 438/634
[58] Field of Search .................................... 438/424, 427, 438/443, 633, 634, 692, 761, 763

[56] References Cited

U.S. PATENT DOCUMENTS

| | | |
|---|---|---|
| 5,084,419 | 1/1992 | Sakao . |
| 5,114,875 | 5/1992 | Baker et al. . |
| 5,162,254 | 11/1992 | Usui et al. . |
| 5,169,491 | 12/1992 | Doan . |
| 5,173,439 | 12/1992 | Dash et al. . |
| 5,246,884 | 9/1993 | Jaso et al. . |
| 5,262,346 | 11/1993 | Bindal et al. . |
| 5,272,117 | 12/1993 | Roth et al. . |
| 5,298,110 | 3/1994 | Schoenborn et al. . |
| 5,302,538 | 4/1994 | Ishikawa et al. . |
| 5,312,512 | 5/1994 | Allman et al. . |
| 5,328,553 | 7/1994 | Poon . |
| 5,346,584 | 9/1994 | Nasr et al. . |
| 5,356,513 | 10/1994 | Burke et al. . |
| 5,362,669 | 11/1994 | Boyd et al. . |
| 5,385,866 | 1/1995 | Bartush . |
| 5,824,360 | 10/1998 | Nagashima ........................ 427/126.2 |

FOREIGN PATENT DOCUMENTS

| | | |
|---|---|---|
| 0 224 646 | 6/1987 | European Pat. Off. . |
| 0 545 263 | 6/1993 | European Pat. Off. . |
| 0 621 630 | 10/1994 | European Pat. Off. . |
| 59-136943 | 8/1984 | Japan . |
| 63-248146 | 10/1988 | Japan . |

OTHER PUBLICATIONS

K.D. Beyer, et al., *Glass Planarization by Stop–Layer Publishing*, IBM Technical Disclosure Bulletin, New York, vol. 27, No. 8, pp. 4700–4701 (Jan. 1985).

Stanley Wolff, *Silicon Processing for the VLSI Era*, vol. 2: Process Integration, Lattis Press, pp. 104–105 (1990). No Month.

*Primary Examiner*—Trung Dang
*Attorney, Agent, or Firm*—Hill & Simpson

[57] ABSTRACT

A layer planarizing method for a semiconductor device is provided to attain excellent controllability of a polishing amount to form a uniform and flat layer without uniformity in polishing in a wafer surface. According to the method, a first layer is deposited over at least a top portion of a stepped portion formed on a surface of a body, the stepped portion covered with the first layer is covered with a second layer having a higher polishing rate than that of the first layer, and the second layer is polished until the first layer deposited on the top portion of the stepped portion is exposed.

8 Claims, 25 Drawing Sheets

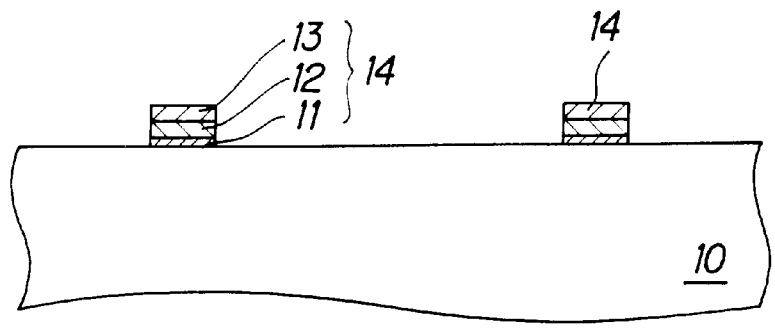
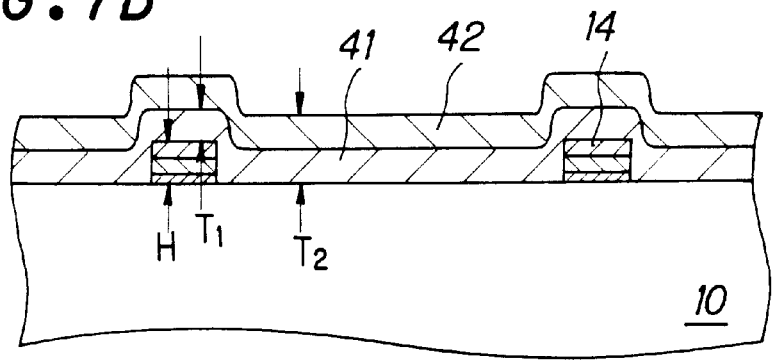
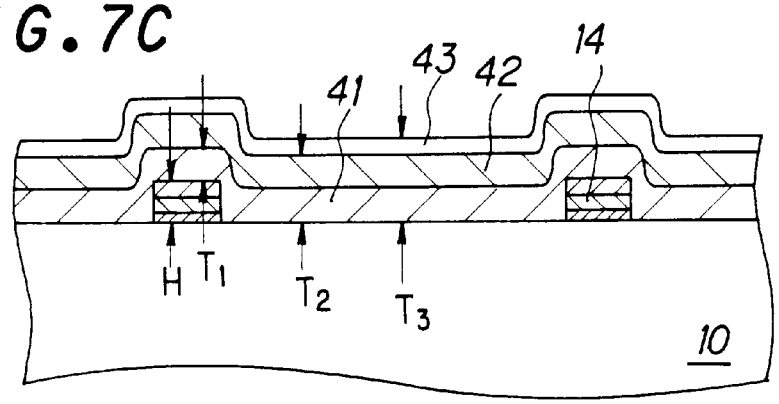
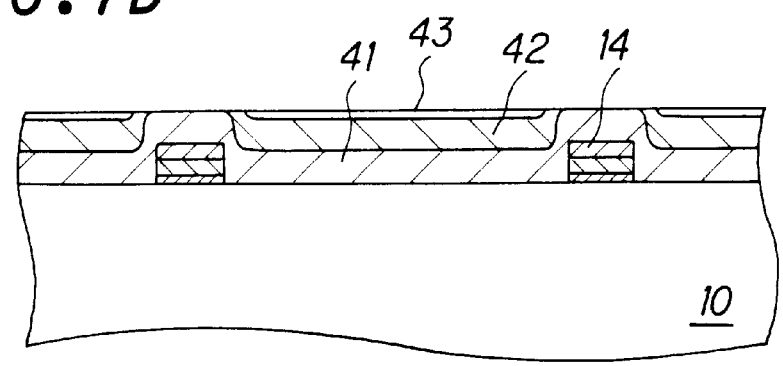

PROCESS FOR PLANARIZING SURFACE OF A SEMICONDUCTOR DEVICE

This is a continuation of application Ser. No. 08/372,942 filed Jan. 7, 1995, now U.S. Pat. No. 5,629,242.

BACKGROUND OF THE INVENTION

The present invention relates to a process for planarizing a surface layer of a semiconductor device in a system for producing the semiconductor device, and more particularly to a process for planarizing a trench element isolation region thereof.

In manufacturing a semiconductor device, it is inevitable to form wires on an interlayer insulating layer, by forming isolation regions of, for example, LOCOS structure or wires on the semiconductor substrate, forming wires on the isolation regions, or forming interlayer insulating layers on the semiconductor substrate. By the wires, isolation regions or the like, a remarkable corrugations or convex/concave portions are formed on a surface of the semiconductor substrate on which wires or the like are formed, the interlayer insulating layers on which the wires or the like are formed, the semiconductor substrate on which the isolation regions of LOCOS structure are formed, the semiconductor substrate or the like having wires or the like formed on the isolation regions of LOCOS structure (hereinafter generally referred to as a semiconductor intermediate product). As a result, a height of the surface of the semiconductor intermediate product is locally changed and not plain.

In accordance with the micro-miniaturization tendency in device size of semiconductor integrated circuits, the wavelength of exposure radiation sources used for lithography has become shorter and shorter. An exposure depth of focus is in proportion to an inverse number of the wavelength. As a result, the exposure depth of focus has become shorter and shorter. Accordingly, if remarkable unevenness or corrugation is present on a surface of an intermediate product of the semiconductor device when a photoresist is applied to the surface of the intermediate product of the semiconductor device and the photoresist is exposed, the height of the surface of an integrated circuit locally varies, the exposure position of the photoresist from a projection optical system would not fall within the optimum exposure depth of focus of the projection optical system. As a result, there would be a problem that a line width of the photoresist pattern on the intermediate product of the semiconductor device obtained by carrying out exposure and development of the photoresist would locally vary in the intermediate product of the semiconductor device. Alternatively, there would be another problem that a configuration of the photoresist pattern is displaced or offset from a desired configuration.

Furthermore, when an interconnection layer is to be formed over an interlayer insulating layer, if remarkable corrugations are present on the surface of the interlayer insulating layer, a local variation in thickness of layer would occur in the interconnection layer. If such an interconnection layer is patterned into a desired configuration, the interconnections made from a thin part of the interconnection layer would be thinned and a breakdown voltage of interconnections formed from a thin interconnection layer would be reduced.

Recently, various techniques have been studied and proposed in which formation of corrugations is avoided on the surface of the intermediate product of the semiconductor device as much as possible. Of these techniques, there are proposed, a borophosphosilicate glass (BPSG) reflow method, an insulating layer accumulation etch-back method, an SOG (Spin On Glass) smoothing method, a method wherein surface convex portions are positively etched for planarization, and a planarizing technique that uses polishing.

An outline of the polishing planarizing technique will be explained below with reference to FIGS. 24A to 24D, which show manufacturing steps.

As shown in FIG. 24A, interconnections 114 are formed on an upper surface of a semiconductor substrate 110. An insulating layer 121 made of silicon oxide is formed on the upper surface of such as a silicon substrate 110 by, for example, a CVD method (see FIG. 24B). Next, as shown in FIG. 24C, the upper surface of the insulating layer 121 is polished to planarize the surface thereof.

On the other hand, the LOCOS method has been conventionally used as an isolation region forming method for the semiconductor device. In the LOCOS method, the silicon semiconductor substrate is selectively thermally oxidized by using a silicon nitride layer as a mask to form an isolation region made of an oxidized layer on the silicon semiconductor substrate. However, upon the thermal oxidization, a so-called birdbeak phenomenon would occur in which the oxidization layer is developed in the horizontal direction of the silicon semiconductor substrate from edge portions of the silicon nitride layer toward the silicon layer. As a result, a conversion difference between a designed mask and a pattern of an actual element separation region would be caused so that it would be difficult to meet a requirement of the micro-miniaturization of the semiconductor elements.

In order to cope with such a problem, a so-called trench element isolation region forming method has been proposed in which trench portions (trenches) are provided on the semiconductor substrate by reactive ion-etching or the like and insulating layers are filled in the trench portions. In the trench element isolation region forming method, after the trench portions (trenches) have been formed in the semiconductor substrate, the insulating layer is accumulated on the surface of the semiconductor substrate as well as the interiors of the trench portions, and the insulating layer is etched back by the reactive ion-etching so that the upper surface of the semiconductor substrate is again exposed while leaving the insulating layers within the trench portions. For example, semiconductor elements are formed on the exposed parts of the semiconductor substrate.

The most significant problem of the conventional trench element isolation region forming method resides in a planarizing method of the insulating layer. Namely, the trench element isolation region forming method based upon such an etch-back technique suffers from a problem that, when the insulating layer is etched back, no insulating layer is left within the trench portion which is large in width for forming a wide field region. Accordingly, in the method using such an etch-back technique, the LOCOS method has to be used together. More specifically, the isolation region is formed for the narrow trench portion by the trench element isolation region forming method, whereas the isolation region (wide field region) is formed for the wide trench portion by the LOCOS method. In such an isolation forming method which requires both the LOCOS method and trench element isolation region forming method, the number of steps is increased and the work is complicated. Therefore, this method is unsuitable for the mass-production of semiconductor devices.

On the other hand, typical planarizing methods in which the amount of the left insulating layer would hardly be changed depending upon a width of the portion where the isolation region is to be formed and in which all the isolation regions may be formed only by the trench element isolation region forming method are, for example, a chemical mechanical polishing method (CMP method), a mechanical polishing method and the like. According to the trench element isolation region forming method based upon the CMP method or the like, it is possible to form a wide element isolation region having a width of 10 μm to 1,000 μm (i.e., wide field region) and to considerably reduce the isolation region forming steps. Accordingly, the CMP method or mechanical polishing method has recently been noticed as a trench element isolation region forming method which is the most contributable to the productability.

However, the above-described planarizing method that uses the BPSG reflow method, the insulating layer deposition etch-back method or the SOG smoothing method allows unevenness to be only locally suppressed. Therefore, the conventional method cannot solve the above-described problems in terms of photolithography. The method wherein the surface is planarized by positively etching projections on the surface involves the problems that the etch rate must be controlled and that the number of process steps increases.

With the corrugation smoothing method that uses the polishing planarizing technique, when the insulating layer 121 is polished, the polishing rate or the polishing amount of the insulating layer 121 in a surface of a single wafer (hereinafter simply referred to as a wafer surface) is not uniform. As a result, as shown in FIG. 24C, the layer thickness of the polished insulating layer 121 becomes nonuniform in the wafer surface and further in the semiconductor device intermediate product. Accordingly, the photolithography problems cannot be solved by this method, either. Furthermore, to form connecting holes such as via-holes in the insulating layer 121 above the interconnections 114, it is necessary to form openings in the insulating layer 121 above the interconnections 114 (see FIG. 24D). In the case where the layer thickness of the insulating layer 121 above each interconnection 114 varies, it is necessary to increase the etch rate for the portions of the insulating layer 121 where the layer thickness is relatively large. The method involves a problem that the etching condition of the insulating layer 121 becomes complicated. Also, in a polishing process in which a polishing rate is not kept constant, since the polishing amount depends upon the variation of the polishing rate, it is very difficult to control the layer thickness of the insulating layer 121 after polishing.

The conventional trench element isolation forming method using the CMP method or mechanical polishing method suffers from two problems. Namely, it involves one problem that the semiconductor substrate including the isolation region formed by polishing would be damaged (see FIG. 25A which is a schematic view) and the other problem of uniformness in polishing in the wafer surface. If the damage is generated in the element isolation region, the breakdown voltage of the isolation region is reduced. Also, if the damage is generated in the semiconductor substrate, when the semiconductor element is formed in the region of the semiconductor substrate, for example, a leak current of the semiconductor element is increased. Incidentally, in FIG. 25A, reference numeral 110 denotes the semiconductor substrate, numeral 130 denotes a bottom portion (recess) of a stepped portion formed in the semiconductor substrate, numeral 141 denotes the insulating layer formed of, for example, $SiO_2$, and numeral 131 denotes the isolation region.

The generation of the damage of the semiconductor substrate may be improved to some extent by sacrificing with the polishing rate or flatness of the insulating layer 141. More specifically, if, for instance, a colloidal silica where a secondary particle diameter of polishing powder used in the CMP method is reduced to a small value (about 10 nm or less) is used, and a piece of polishing cloth having a low hardness as a piece of polishing cloth (about 70 to 80 in terms of Asker-C hardness) is used, it is possible to suppress the damage of the semiconductor substrate. However, in this case, the polishing rate is low (about 10 nm/min or less), and the amount of removal of convex portions relative to the polishing amount is also small. Accordingly, it takes two hours or more to polish a piece of wafer, and hence, the through-put is extremely low. If the wafer has a large aperture, there is a problem in uniformity of polishing within the wafer. As a result, it is difficult to simultaneously process a plurality of pieces of wafer. Accordingly, it is not practical to solve the problem of generation of the damage of the semiconductor substrate by such a method.

In case of selectively removing the insulating layer by the CMP method, the insulating layer is removed by both chemical reaction of the insulating layer with the polishing liquid and mechanical polishing of the insulating layer by the polishing material. Therefore, in order to solve the problem of the generation of the damage in the semiconductor substrate according to another method, it is possible to use a method for enhancing the chemical polishing characteristics by the CMP method. Namely, there is a method in which a silicon oxide layer or a polycrystalline silicon layer containing impurities is accumulated to form the insulating layer and the latter layer is planarized by the CMP method. The polishing of the insulating layer is developed by the chemical reaction between the impurities contained in the insulating layer and the polishing liquid. Therefore, the generation of the damage of the semiconductor substrate is reduced, and the polishing rate is relatively high at about 100 nm/min. Accordingly, there is no problem in through-put.

However, the above-described approach suffers from a problem in which, since the polishing of the insulating layer is isotropically developed by enhancing the chemical polishing property, the layer thickness of the wide bottom portion (recess) of the stepped portion is reduced (so-called dishing). This phenomenon is schematically shown in FIGS. 25B and 25C. Incidentally, in FIG. 25B, the position of the surface of the insulating layer 141 which is being polished is indicated by the dotted line.

On the other hand, the problems of non-uniformity in the wafer surface involves two causes. One cause is a distribution (gradient) of the accumulation layer thickness of the insulating layer in the wafer surface, and the other cause is a distribution (gradient) of the polishing rate in the wafer surface. In a current insulting layer accumulation apparatus (for example, CVD apparatus) for processing wafers having a diameter of 8 inches, the distribution (gradient) of the accumulation layer thickness of the insulating layer in the wafer surface is ±3 to 5%. On the other hand, the current chemical mechanical polishing apparatus for processing wafers having a diameter of 8 inches, the polishing rate within the wafer surface is varied in the range of at least about ±3 to 5%.

Accordingly, if these variations are added, the polishing uniformity within the wafer surface is varied in the range of at least ±3 to 5%. In the conventional trench element isolation region forming method, since the insulating layer is made of a kind of material, the polishing or cutting amount of the insulating layer in the wide bottom portion (recess) of the stepped portion formed in the semiconductor substrate is increased. Accordingly, in order to positively leave the insulating layer within the wide bottom portion and to planarize the insulating layer as much as possible, it is necessary to select the thickness of the insulating layer to be accumulated to a height which is approximately twice larger than that of the stepped portion. For instance, if the height of the stepped portion is 0.5 μm, the thickness of the insulating layer to be accumulated is about 1 μm, and the polishing uniformity in the wafer surface is varied in the range of at least ±50 to 100 nm.

Japanese Patent Application Laid-Open No. Sho 59-136943 discloses an isolation region forming method in which the insulating layer which has a thickness that is at least greater than a depth of the groove is accumulated over the entire surface, and thereafter, such an insulating layer is removed by the CMP method. However, in the technique disclosed in this publication, the insulating layer is basically formed of a kind of material or two insulating films each of which is made of material having substantially the same polishing rate. Accordingly, it is difficult to solve the dishing phenomenon problem. Also, since the insulating layer having the greater thickness than the depth of the groove is accumulated over the entire surface, the polishing uniformity within the wafer surface would be degraded.

SUMMARY OF THE INVENTION

Accordingly an object of the present invention is to provide a layer planarizing method for a semiconductor device, to attain excellent controllability of a polishing amount to form a uniform and flat layer without uniformity in polishing in a wafer surface.

Another object of the invention is to provide a layer planarizing method which establishes the compatibility of preventing any damage to the substrate and making uniform polishing within the wafer surface, which was not attained in the convention trench element isolation forming step by a chemical mechanical polishing method or a mechanical polishing method.

In order to attain these and other object, according to a first aspect of the invention, there is provided a process for planarizing a surface of a semiconductor device, comprising the steps of:

(a) depositing a first layer over at least a top portion of a stepped portion formed on a surface of a substrate;

(b) covering the stepped portion, covered with the first layer, with a second layer having a higher polishing rate than that of the first layer; and (c) polishing the second layer until the first layer deposited on the top portion of the stepped portion is exposed.

The stepped portion may be formed of, for example, an interconnection or wiring, an isolation region or the like. A substrate or body may be exemplified as a semiconductor substrate, an interlayer insulating layer formed on a semiconductor substrate and a well formed within a semiconductor substrate. Also, a "higher" polishing rate and a "lower" polishing rate are defined as follows. When a layer is polished by the same polishing apparatus and under the same polishing conditions, assuming that a polishing rate of one layer is represented by $R_{R1}$, and a polishing rate of another layer is represented by $R_{R2}$, $R_{R1}$ is at least twice greater than $R_{R2}$, then the polishing rate of the first one is higher than that of the other one. Also, when the first layer is exposed, there are some cases where the first layer is polished or other cases where the first layer is not polished. This is the case also in the following description.

In the planarizing process for a surface of the semiconductor device according to the first aspect of the invention, when H is the height of the stepped portion, $T_1$ is the thickness of the first layer on a top portion of a stepped portion, and $T_2$ is the height from a bottom surface of the stepped portion to a surface of the second layer, it is preferable that the height $T_2$ be smaller than or substantially equal to a value of $(H+T_1)$. The term "substantially equal" is more accurately expressed by the following relation although it depends upon the polishing apparatus or the polishing condition:

$$|T_2-(H+T_1)| \leq 0.1 \mu m$$

In the case where the value of $T_2$ is much smaller than that of $(H+T_1)$, in the above-described step (c), there is a fear that the second layer above the bottom portion of the stepped portion would not be polished. In this case, the smoothness of the entire layer would be worse.

Also, it is possible to further include a step for removing the first layer on the top portion of the stepped portion after the step (c). According to this step, it is possible to form, for example, a semiconductor element on the top portion of the stepped portion from which the first layer has been removed. On the other hand, the bottom portion of the stepped portion which is filled by the second layer constitutes, for example, a trench element isolation region.

In the planarizing process for a surface of the semiconductor device according to the first aspect of the invention, it is preferable that the first layer comprises a laminate of at least one selected from the group consisting of silicon oxide and silicon nitride and the second layer comprises a laminate of at least one selected from the group consisting of silicon oxide containing impurities and polycrystalline silicon. With such a composition for the first and second layers, it is possible to ensure a sufficient polishing rate ratio. Incidentally, the silicon oxide includes SiON as well as $SiO_2$. This is the case in the following description.

According to a second aspect of the present invention, there is provided a process for planarizing a surface of a semiconductor device, comprising the steps of:

(a) forming a first layer having a thickness $T_1$ at least on a top portion of a stepped portion having a height H, the stepped portion being formed on a body;

(b) covering the stepped portion, covered with the first layer, with a second layer having a higher polishing rate than that of the first layer, so that a height $T_2$ from a bottom surface of the stepped portion to a surface of the second layer is smaller than or substantially equal to a value of $(H+T_1)$;

(c) forming on the second layer a third layer having a lower polishing rate than that of the second layer; and (d) polishing the second layer and the third layer until the first layer formed on the top portion of the stepped portion is exposed.

Here, the term "substantially equal" is more accurately expressed by the following relation although it depends upon the polishing apparatus or the polishing condition:

$$|T_2-(H+T_1)| \leq 0.1 \mu m$$

In the case where the value of $T_2$ is much greater than that of $(H+T_1)$, in the step (d), the first layer on the top portion of the stepped portion would not serve as a stopper, and there is a fear that the first layer formed on the top portion of the stepped portion would not be exposed. In this case, the smoothness of the entire layer would be worse.

In the planarizing process for a semiconductor according to the second aspect of the invention, it is preferable to meet the following condition although it depends upon the polishing apparatus or the polishing condition:

$$|T_3-(H+T_1)| \leq 0.1 \, \mu m$$

to ensure the exposure of the first layer formed on the top portion of the stepped portion and to further uniformly smooth the entire layer. In case of $|(T_2+T_3)-(H+T_1)|>0.1$ $\mu$m, there is a gentle stepped portion on a layer surface defined by the first, second and third layers. However, depending upon the situation, this is acceptable. It is preferable to meet the following condition although it depends upon the polishing apparatus or the polishing condition:

$$|T_2-(H+T_1)| \leq 0.1 \, \mu m$$

to ensure the exposure of the first layer formed on the top portion of the stepped portion and to further uniformly smooth the entire layer.

In the case where the stepped portion is formed by the trench element isolation region, it is preferable to further meet $H \leq T_2$. In the case of $T_2<H+T_1$, it is preferable to meet $H+T_1<T_3$ or $H<T_3<H+T_1$. In case of $T_3<H$, there is a fear that an electric field would be concentrated on, for example, a corner of the stepped portion.

In the planarizing process for a semiconductor device according to the second aspect of the invention, it is possible to further includes a step for removing the first layer on the top portion of the stepped portion after the step (d). According to this step, it is possible to form, for example, a semiconductor element on the top portion of the stepped portion from which the first layer has been removed. On the other hand, the bottom portion of the stepped portion which is filled by the second layer and the third layer constitutes, for example, a trench element isolation region.

In the first embodiment of the process for planarizing the surface of the semiconductor device according to the second aspect of the invention, the forming the first layer (step (a)) may comprise forming the first layer on a surface of the body including the bottom portion of the stepped portion after forming the stepped portion composed of a recess portion in the body. Also, in the second embodiment of the process for planarizing the surface of the semiconductor device according to the second aspect of the invention, the forming the first layer (step (a)) may comprise forming the first layer composed of a recess portion in the body after forming the first layer on the body. In these cases, it is preferable that the first layer comprises a laminate of at least one selected from the group consisting of silicon oxide and silicon nitride, the second layer comprises a laminate of at least one selected from the group consisting of silicon oxide containing impurities and polycrystalline silicon and the third layer comprises a laminate of at least one selected from the group consisting of silicon oxide and silicon nitride. With such a structure of the first, second and third layers, it is possible to insure a sufficient polishing rate ratio.

In the third embodiment of the process for planarizing the surface of the semiconductor device according to the second aspect of the invention, the forming the first layer (step (a)) may comprise, after forming an oxide layer and an upper layer on the body, forming the stepped portion composed of a recess portion in the body and forming an oxide layer on side walls and a bottom surface of the recess portion, and the first layer on the top portion is composed of the oxide layer and the upper layer, and the first layer on the bottom surface of the stepped portion is composed of the oxide layer. In this case, it is preferable that the upper layer which forms the first layer is made of silicon nitride, and the oxide layer which forms the first layer is made of silicon oxide. It is also preferable that the second layer comprises a laminate of at least one selected from the group consisting of silicon oxide containing impurities and polycrystalline silicon and the third layer comprises a laminate of at least one selected from the group consisting of silicon oxide and silicon nitride.

In order to attain the above-described and other objects, according to a third aspect of the present invention, there is provided a process for planarizing a surface of a semiconductor device, comprising the steps of:

(a) covering, with a first layer, n-times overlapped stepped portions formed on a body;

(b) repeating (k−1) times the steps of forming on a (2m−1)-th layer a 2m-th layer having a higher polishing rate than that of the (2m−1)-th layer, where m is 1, 2, . . . , k, and $2 \leq k$), and subsequently forming on a 2m-th layer a (2m+1)-th layer having a lower polishing rate than that of the 2m-th layer;

(c) forming on a (2k−1)-th layer a 2k-th layer having a higher polishing rate than that of the (2k−1)-th layer; and (d) polishing the 2k-th layer to the second layer so that a first layer formed on an uppermost portion of the n-times overlapped stepped portions.

According to a third aspect of the present invention, it is preferable that a value of $T_{2k}$ is greater than or substantially equal to $(H+T_1)$ where H is the height from the lowermost surface to the uppermost portion of the n-times overlapped stepped portions, $T_1$ is the thickness of the first layer in the uppermost portion of the n-times overlapped stepped portions, and $T_{2k}$ is the height from the lowermost surface of the n-times overlapped stepped portions to the top surface of the 2k-th layer ($2 \leq k$). Here it is preferable to meet the following relation although it depends upon the polishing apparatus or the polishing condition:

$$|T_{2k}-(H+T_1)| \leq 0.1 \, \mu m$$

In the case where the value of $T_{2k}$ is much smaller than that of $(H+T_1)$, in the above-described step for exposing the first layer formed on the top portion of the stepped portion by polishing the 2k-th layer, there is a fear that the uppermost 2k-th layer above the bottom portion of the stepped portion would not be polished. In this case, the smoothness of the entire layer would be worse.

In this case, it is preferable that a height $T_{2j+1}$ from the lowermost portion of the n-times overlapped stepped portions to a surface of the (2j+1)-th layer (where j=1, 2, . . . , k−1, $2 \leq k$) is substantially represented by the following condition:

$$T_1 + \sum_{i=n-j+1}^{n} H_i$$

where k is equal to n (i.e., the multi-layer is composed of 2n layers), $T_1$ is the thickness of the first layer on the top portion of the n-times overlapped stepped portions, and $H_1$ is the height of the i-th stepped portion (where i=1, 2, . . . , n) from the lowermost portion of the n-times overlapped stepped portions.

Here, the term "substantially equal" is more accurately expressed by the following relation although it depends upon the polishing apparatus or the polishing condition:

$$\left| T_{2j+1} - \left( T_1 + \sum_{i=n-j+1}^{n} H_i \right) \right| \leq 0.1 \, \mu m$$

Incidentally, it is preferable that the 2m-th layer (where m=1, 2, ..., k, and 2≦k) comprises a laminate of at least one selected from the group essentially consisting of silicon oxide containing impurities and polycrystalline silicon and the (2m−1)-th layer comprises a laminate of at least one selected from the group consisting of silicon oxide and silicon nitride. With such a structure of each layer, it is possible to insure the sufficient polishing rate ratio.

The process according to the third aspect of the invention may further comprise, between the step (c) and the step (d), the step of: forming on the 2k-th layer the (2k+1)-th layer having a lower polishing rate than that of the 2k-th layer. In addition, the step (d) may comprise the step of polishing the (2k+1)-th layer to the second layer. Thus, the uppermost layer becomes the (2k+1)-th layer having a lower polishing rate so that the uppermost (2k+1)-th layer above the bottom portion of the stepped portion serves as a polishing stopper to further smooth the overall layer.

The process according to the third aspect of the invention may further satisfy the following condition, although it depends upon the used polishing apparatus or the polishing conditions:

$$|T_{2k+1} - (H+T_1)| \leq 0.1 \, \mu m$$

where H is the height from the lowermost surface to the uppermost portion of the n-times overlapped stepped portions, $T_1$ is the thickness of the first layer in the uppermost portion of the n-times overlapped stepped portions, and $T_{2k+1}$ is the height from the lowermost surface of the n-times overlapped stepped portions to the top surface of the (2k+1)-th layer. Incidentally, in the case where $T_{2k+1}$ is out of this range, there is a gentle stepped portion on a layer surface defined by each layer. However, depending upon the situation, this is acceptable. It is preferable to meet the following condition although it depends upon the polishing apparatus or the polishing condition:

$$|T_{2k} - (H+T_1)| \leq 0.1 \, \mu m$$

to ensure the exposure of the first layer formed on the top portion of the stepped portion and to further uniformly smooth the entire layer.

Furthermore, it is preferable that a height $T_{2j+1}$ from the lowermost portion of the n-times overlapped stepped portions to a surface of the (2j+1)-th layer (where j=1, 2, ..., k−1, 2≦k) is substantially represented by the following condition:

$$T_1 + \sum_{i=n-j+1}^{n} H_i$$

where k is equal to n (i.e., the multi-layer is composed of (2n+1) layers), $T_1$ is the thickness of the first layer on the top portion of the n-times overlapped stepped portions, and $H_i$ is the height of the i-th stepped portion (where i=1, 2, ..., n) from the lowermost portion of the n-times overlapped stepped portions. Here, the term "substantially equal" is more accurately expressed by the following relation although it depends upon the polishing apparatus or the polishing condition:

$$\left| T_{2j+1} - \left( T_1 + \sum_{i=n-j+1}^{n} H_i \right) \right| \leq 0.1 \, \mu m$$

Incidentally, it is preferable that the (2m'−1)-th layer (where m'=1, 2, ..., k+1, and 2≦k) comprises a laminate of at least one selected from the group consisting of silicon oxide and silicon nitride and the 2m-th layer (where m=1, 2, ..., k, and 2≦k) comprises a laminate of at least one selected from the group consisting of silicon oxide containing impurities and polycrystalline silicon. With such a structure, it is possible to insure a sufficient polishing rate ratio.

Throughout the specification, a thickness of each layer, a height of the surface thereof and a height of the stepped portion means arithmetic averages of a suitable number of the measured points.

The polishing of the layers may be carried out by a mechanical polishing method or a chemical mechanical polishing method (CMP method).

In the case where the polishing is carried out by the CMP method, it is necessary to meet the two requirements that the polishing rate of the second layer or the 2m-th layer is high, and the second layer or the 2m-th layer should be chemically polished. However, actually, a layer having a chemical polishability has a higher mechanical polishing rate than a layer having only a mechanical polishability. Accordingly, it is sufficient to select the second layer or the 2m-th layer from material having chemical polishability. However, in the case where the material is limited to the silicon oxide system material, the selection out of the chemical polishable materials is considerably limited. This is because polishing powder of polishing material which is generally used in the field is made of silicon oxide. If an etching property is imparted by mixing HF or the like into the polishing material, the polishing particle is dissolved, resulting in instability in particle diameter of the polishing powder.

Accordingly, the second layer or the 2m-th layer is preferably made of a laminate of silicon oxide containing impurities and/or polycrystal silicon. The silicon oxide containing impurities may be selected form BPSG, PSG, BSG, AsSG, PbSG, SbSG and the like. If the second layer or the 2m-th layer is made of these materials, it is possible to carry out a chemical etching to the materials with, for example, an alkaline polishing solution containing KOH or an alkaline polishing material such as colloidal silica which is usually available on the market. The second layer or the 2m-th layer made of these materials is superior in coverage against the stepped portion.

In order to enhance the coverage of the silicon oxide containing impurities, it is general that the reflow thermal treatment is effected at a high temperature in the range of 900 to 950° C. Accordingly, it is impossible to effect the reflow thermal treatment after formation of wirings made of aluminum or the like. Namely, the desirable coverage characteristics (aspect ratio up to about 1.5) obtained by the reflow thermal treatment are limited by the step where the semiconductor device and the like may stand the high temperature treatment above 900° C. The formation of the trench element isolation region is a pretreatment prior to the formation of the high concentration diffusion layer to the semiconductor body. Accordingly, even if the reflow thermal treatment at 900° C. and for about 30 minutes is applied to the oxide silicon containing the impurities, there is no serious problem in the electric characteristics of the semiconductor device. Thus, the usage of BPSG or the like in the formation of the trench element isolation region is effective also to enhance the coverage of the stepped portion.

In the process for planarizing a surface of a semiconductor device according to the present invention (hereinafter simply referred to also as a layer planarizing method), the first layer, the third layer, the (2m−1)-th layer or the (2k+1)-th layer having a lower polishing rate is formed. These layers serve as polishing stoppers in the polishing treatment. Accordingly, it is possible to avoid a reduction in thickness of a layer (dishing) particular in a wide bottom portion (recess portion) of the stepped portion. Also, it is possible to effectively avoid a damage of evenness of the second layer, the 2m-th layer or the 2k-th layer and a reduction in thickness of the overall layers on the bottom portion of the stepped portion exceeding a predetermined level.

In the planarizing method according to the first aspect of the invention, two layers which are different in polishing rate are laminated on the top portion of the stepped portion. As a result, when the second layer is polished, the first layer formed on the top portion of the stepped portion serves as a stopper for polishing. As a result, it is possible to avoid a reduction in thickness of the second layer above the bottom portion of the stepped portion formed in the body, to enhance the polishing uniformity within the wafer surface and to effectively suppress the generation of the damage to the body.

In the planarizing method according to the second aspect of the invention, three layers which are different in polishing rate are laminated on the top portion of the stepped portion. Also, at least two layers which are different in polishing rate are laminated on the bottom portion of the stepped portion. As a result, when the second layer and third layer are polished, the first layer formed on the top portion of the stepped portion and the third layer formed above the bottom portion of the stepped portion serve as stoppers for polishing. As a result, it is possible to avoid a reduction in thickness of the second layer above the bottom portion of the stepped portion formed in the body, to further enhance the polishing uniformity within the wafer surface and to further effectively suppress the generation of the damage to the body.

In the planarizing method according to the third aspect of the invention, 2k layers which are different in polishing rate are laminated on the topmost portion of the stepped portion. As a result, when the 2k-th layer to the second layer are polished, the first layer formed on the topmost portion of the stepped portion and the (2m−1)-th layers formed above the stepped portion or the bottom portion of each stepped portion serve as stoppers for polishing. As a result, it is possible to avoid a reduction in thickness of the 2m-th layer or the 2k-th layer above the bottom portion of the stepped portion formed in the body, to further enhance the polishing uniformity within the wafer surface and to further effectively suppress the generation of the damage to the body. Also, if (2k+1) layers which are different in polishing rate are laminated on the topmost portion of the stepped portion, when the (2k+1)-th layer to the second layer are polished, the first layer formed on the topmost portion of the stepped portion, the (2m−1)-th layers formed above the stepped portion or the bottom portion of each stepped portion and the (2k+1)-th layer formed above the bottom portion of the stepped portion serve as stoppers for polishing. As a result, it is possible to avoid a reduction in thickness of the 2m-th layer or the 2k-th layer above the bottom portion of the stepped portion formed in the body, to further enhance the polishing uniformity within the wafer surface and to further effectively suppress the generation of the damage to the body.

Furthermore, according to the planarizing method of the invention, it is possible to avoid a reduction in thickness of the layer above the bottom portion of the stepped portion formed in the body and to enhance the polishing uniformity within the wafer surface. It is therefore possible to avoid a problem of an exposure depth of focus in a photolithographic technique and a problem caused by etching of an insulating layer due to non-uniformity in thickness of the insulating layer upon the formation of connection holes.

In addition, in the planarizing method according to the second or third aspect of the invention, the thickness of the overall layers to be laminated on the entire surface of the substrate or body before polishing is substantially equal to or less than a height of the overall stepped portion, for example. Accordingly, the second and third aspects of the invention are quite different from the technique disclosed in Japanese Patent Application Laid-Open No. Sho 59-136943. In addition, two or more layers which are different in polishing rate are laminated, so that there is a considerable difference between the layer character (polishing rate) of the layer on the top portion of the stepped portion and the layer character (polishing rate) of the layer above the bottom portion of the stepped portion. Thus, it is possible to make the thickness of the overall layer structure, which has not yet been polished, substantially equal to or less than a height of the stepped portion.

BRIEF DESCRIPTION OF THE DRAWINGS

In the accompanying drawings:

FIGS. 7A, 7B, 7C and 7D are schematic partial cross-sectional views showing a body and so on for illustrating each step of a layer planarizing method for a semiconductor device according to a sixth embodiment;

DESCRIPTION OF THE PREFERRED EMBODIMENTS

The present invention will now be described by way of example with reference to the accompanying drawings. Incidentally, first to fifth embodiments are related to a layer planarizing method in accordance with a first aspect of the invention. Also, sixth to tenth embodiments are related to a layer planarizing method in accordance with a second aspect of the invention. Furthermore, eleventh to thirteenth embodiments are related to a layer planarizing method in accordance with a third aspect of the invention.

First Embodiment

The first embodiment is related to the planarizing method in accordance with the first aspect of the invention. In the first embodiment, it is intended to planarize an insulating layer to be formed between interconnection layers and to planarize a so-called interlayer insulating layer. In the first embodiment, a base is made of a semiconductor body, and stepped portions are formed of interconnection formed on the body. A first layer is made of silicon oxide ($SiO_2$), and a second layer is made of silicon oxide containing impurities (i.e., BPSG). The first layer is formed not only on a top portion of each stepped portion but also on side walls and bottoms thereof. The second layer is to be polished by the mechanical polishing method. Also, the first layer is used as polishing stoppers not only to improve the uniformity of the polishing effect but also to have a practical function to prevent impurities from being diffused into the body from the second layer made of, for example, BPSG.

The layer planarizing method according to the first embodiment will now be described with reference to FIGS. 1A to 1D which schematically shows the body and the like.

[Step-100]

Figure 1A:
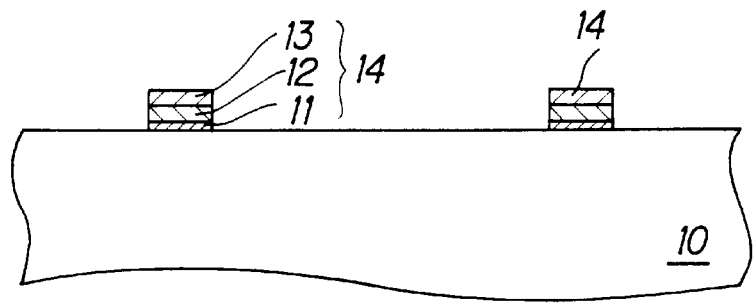
FIGS. 1A, 1B, 1C and 1D are schematic partial cross-sectional views showing a body and so on for illustrating each step of a layer planarizing method for a semiconductor device according to a first embodiment.

First of all, interconnection layers 14 are formed on a base 10 made of a silicon semiconductor body (see FIG. 1A). Namely, for example, on the body 10 are formed a silicon oxide layer 11 of 11 nm in thickness, a phosphorus (P)-doped polycrystalline silicon layer 12 of 0.10 μm in thickness, and a tungsten silicide ($WSi_2$) layer 13 of 0.10 μm in thickness by a known film forming technique. Thereafter, interconnection layer 14 are formed by patterning the tungsten silicide layer 13, the polycrystalline silicon layer 12 and the silicon oxide layer 11 by a photolithographic technique and an etching technique. In the first embodiment, the interconnection layers correspond to stepped portions. In more detail, the top portion of each stepped portion corresponds to a top portion of the interconnection portion. A bottom portion of each stepped portion corresponds to the body 10 exposed between the interconnection layers. A height H of each stepped portion is 0.21 μm.

[Step-110]

Figure 1B:
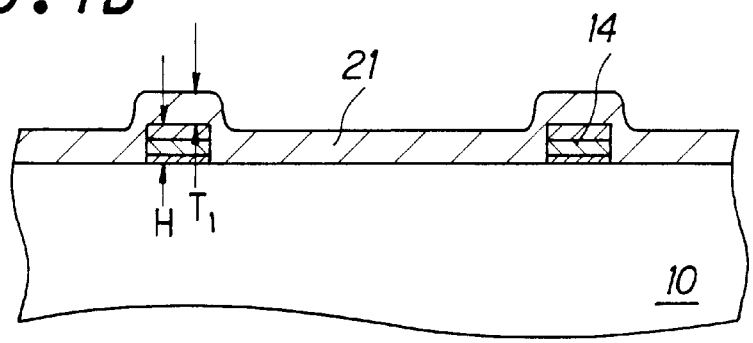

A first layer 21 is formed at least on the top portion formed on the body (see FIG. 1B). In the first embodiment, the first layer 21 is formed not only on the top portion of each interconnection layer 14, i.e., the stepped portion but also on the bottom portion of the stepped portion. The first layer is made of $SiO_2$ and may be deposited by, for example, a plasma CVD method using tetraethoxysilane (TEOS). The thickness $T_1$ of the first layer 21 on the top portion of the stepped portion is 0.60 μm. Deposition conditions for the film formation are, for example, as follows:

| Used gas: | $O_2/H_2 = 6/1.5_{sccm}$ |
|---|---|
| Film growth temperature: | 850° C. |
| Film growth time: | 100 minutes |
| $T_1$: | 0.60 μm |

[Step-120]

Figure 1C:
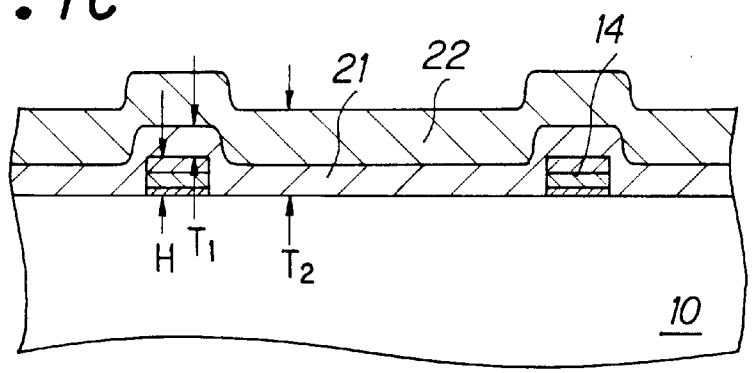

Next, a second layer 22 having a higher polishing rate than that of the first layer 21 is formed to cover the stepped portion (FIG. 1C). In the first embodiment, the second layer 22 is formed of a BPSG layer by, for example, a low-pressure CVD method. The BPSG layer is, for example, formed so that a weight concentration of boron (B) is 4%, and a weight concentration of phosphorus (P) is 7%. A thickness of the second layer 22 at the bottom portion of the stepped portion is set at 0.40 μm. Namely, a height $T_2$ of the surface of the second layer 22 from the bottom surface of the stepped portion is 1.0 μm (=0.60 μm+0.40 μm). Accordingly, a relationship $T_2$ (=1.0 μm)>(H+$T_1$) (0.81 μm=0.21 μm+0.60 μm) is met. Deposition conditions for the second layer 22 are, for example, as follows. Incidentally, it is preferable to reflow the second layer 22 made of BPSG, for example, at a temperature of 900° C. for 20 minutes in a nitrogen gas atmosphere after the formation of the second layer 22.

Used gas: $SiH_4/PH_3/B_2H_6$

Deposition Temperature 400° C.

Reaction pressure: normal pressure

[Step 130]

Figure 1D:
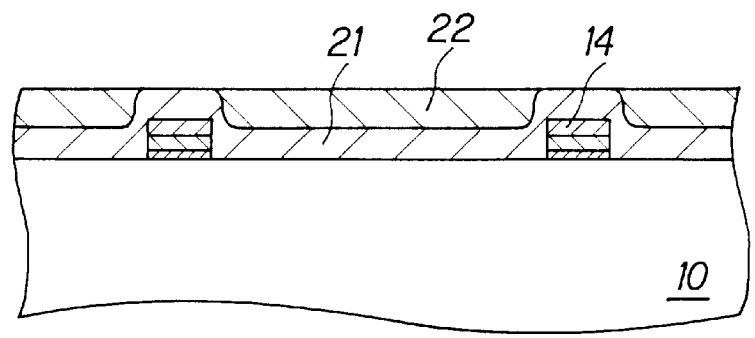

Thereafter, the second layer 22 is polished to the first layer 21 formed on the top portion of the interconnection layer 14, i.e., the stepped portion (see FIG. 1D). The polishing is based upon the mechanical polishing method. For example, as a piece of polishing cloth, a velour type cloth [hardness (Asker-C): about 82 to 85, for example] is used, and as a polishing solution, a mixture of fumed silica and pure water in the ratio of 1:2 is used. In addition, a feed rate of the polishing solution is set at 30 cm$^3$/min., a polishing pressure at 130 g/cm$^2$, and a rotating speed at 38 rpm. Under these conditions, polishing is carried out.

Thus, the first layer 21 is left on the top portion of the interconnection layer 14, i.e., stepped portion, and a layer composed of the first layer 21 and the second layer 22 is formed on the body 10 which is the bottom portion of the stepped portion. The surface of the first layer 21 on the top portion of the interconnection layer 14, i.e., stepped portion is substantially flush with the surface of the second layer 22 over the bottom portion of the stepped portion. Namely, in the first embodiment, the interconnection layer structure is composed of a plurality of interconnection layers 14 formed on the body 10 and the first layer 21 formed on each interconnection layer 14, and the first layer 21 and the second layer 22 formed on the body 10 between the interconnection layers 14, with the surface of the first layer 21 being substantially flush with the surface of the second layer 22.

In the above-described planarizing method, the polishing rate of the first layer 21 which is made of silicon oxide, is 12 nm/min., and on the other hand, the polishing rate of the second layer 22, which is made of BPSG, is 100 nm/min. Accordingly, the polishing rate of the second layer 22 is about eight times higher than the polishing rate of the first layer 21, and hence a satisfactory selectivity may be insured. Accordingly, when the polishing of the second layer 22 over the interconnection layers 14, i.e., stepped portions proceeds until the first layer 21 over the top portions of the interconnection layers 14, i.e., convex portions which form projections, is exposed, the polishing rate becomes relatively low at the exposed portions (i.e, the first layer 21). Thus, even if the polishing rate in the polished surface becomes nonuniform, since the second layer 22 is easier to polish than the first layer 21, the polishing rate is held down at the portions of the first layer 21 which have been first exposed.

Figure 22A:
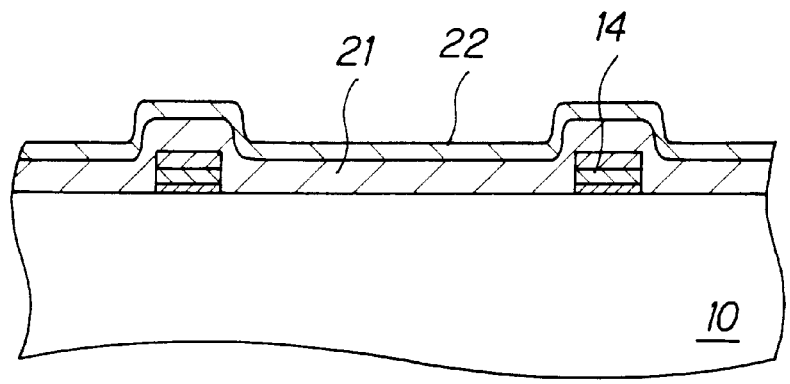
FIGS. 22A and 22B; and 22C and 22D are schematic partial cross-sectional views of a body and so on showing problems caused in the case where unsuitable layer thicknesses are selected for a second layer in the first and second embodiments, respectively.
Figure 22B:
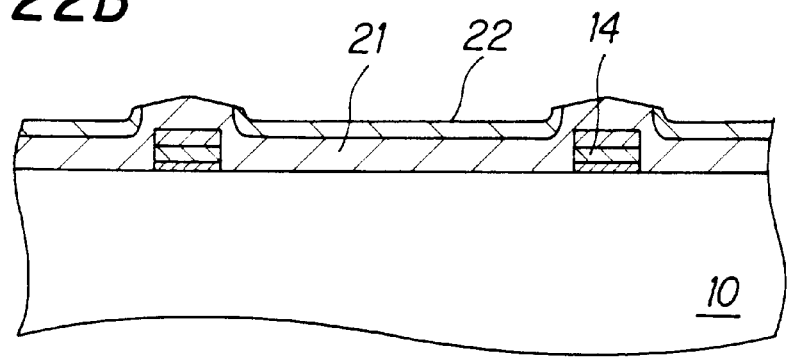

With the first layer 21, which has a lower polishing rate, used as a polishing stopper, the second layer 22 is polished until the first layer 21 over other interconnection layers 14 is exposed. In this way, polishing is performed until the first layer 21 over all the interconnection layers 14 is exposed. Thus, the sum in thicknesses of the first and second layers 21 and 22 at the bottom portion of the stepped portion is made uniform in the wafer surface. As a result, planarizing of the layer in the wafer surface is generally realized. Incidentally, as shown in FIG. 22A, in the case where the value of $T_2$ is much smaller than the value of H+$T_1$, there is a fear that the second layer 22 over the bottom portion of the stepped portion would not be polished in Step-130 as shown in FIG. 22B.

Modification of First Embodiment

Figure 2A:
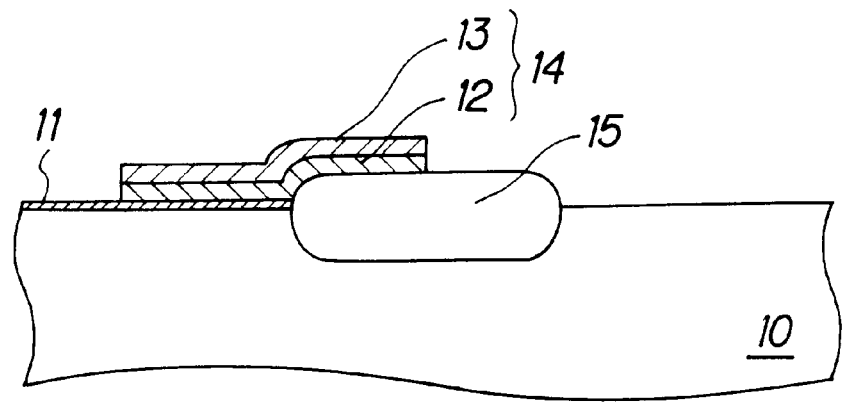
FIGS. 2A, 2B and 2C are schematic partial cross-sectional views showing a body and so on for illustrating each step of a layer planarizing method for a semiconductor device according to a modification of the first embodiment.

In a modification of the first embodiment, the body 10 is made of a semiconductor body, and a stepped portion is made of an interconnection layer 14 formed on an isolation region 15 having a LOCOS structure formed on the body (see FIG. 2A). Namely, the stepped portion is of double layer type with the first stepped portion being composed of the isolation region 15 having the LOCOS structure and the second stepped portion being composed of the interconnection layer 14.

Figure 2B:
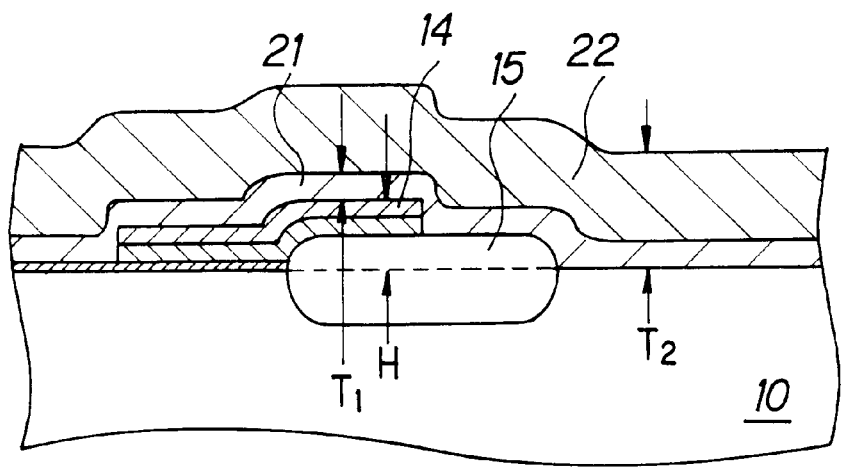
Figure 2C:
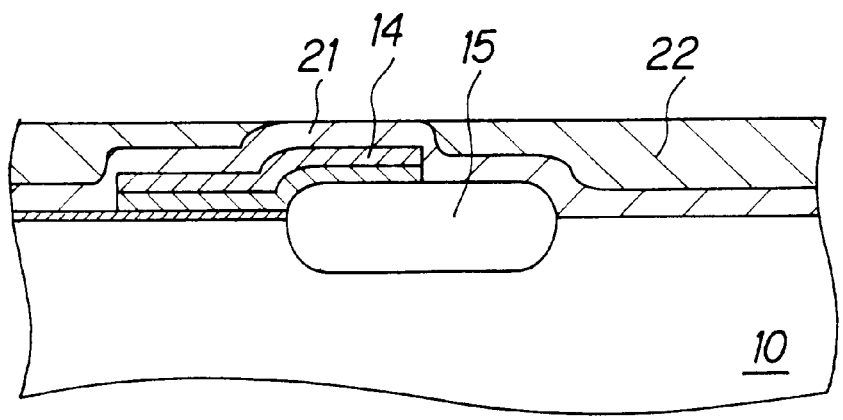

In the same way as in the first embodiment, the first layer is made of silicon oxide ($SiO_2$) and the second layer is made of BPSG. Also, the second layer is polished by the mechanical polishing method. The layer planarizing method in the modification of the first embodiment may be carried out by the same steps as those for the first embodiment except for the difference of the structure of the stepped portion. Therefore, detailed explanation therefor will be omitted. Incidentally, the height H of the stepped portion is 0.35 μm. Namely, the first stepped portion made of the isolation region 15 (a height from the body 10 to the top surface of the isolation region 15) is 0.15 μm, and the height of the interconnection layer 15 (height of the interconnection layer) is 0.20 μm. FIGS. 2A, 2B and 2C are partial schematic cross-sectional view showing the body and the like in accordance with the modification of the first embodiment [Step-100A] (corresponding to [Step-100] of the first embodiment),[Step-120A] (corresponding to [Step-120] of the first embodiment), and [Step-130A] (corresponding to [Step-130] of the first embodiment).

Second Embodiment

A second embodiment is also related to the layer planarizing method in accordance with the first aspect of the invention. In the second embodiment, it is intended to form the trench element isolation region. In the second embodiment, the body is constituted by a semiconductor body, and the stepped portion is constituted by a recess portion formed in the body. A first layer is made of silicon oxide ($SiO_2$), and a second layer is made of silicon oxide containing impurities (i.e., BPSG). The first layer is formed not only on a top portion (surface of the body) of each stepped portion but also on side walls and bottoms (recess portion formed in the body) of the stepped portion. The second layer is to be polished by the mechanical polishing method. Also, the first layer is used as polishing stoppers not only to improve the uniformity of the polishing effect but also to have a practical function to prevent impurities from being diffused into the body from the second layer made of, for example, BPSG.

The layer planarizing method according to the second embodiment will now be described with reference to FIG. 3A to 3D which schematically shows the body and the like.

[Step-200]

First of all, recess portions 30 are formed in a base 10 made of a silicon semiconductor body. The recess portions 30 are formed by a well known photolithographic technique and a well known etching technique. The recess portions 30 correspond to the stepped portions. More specifically, the top portions of the stepped portions correspond to the surface of the body, the bottom portions of the stepped portions correspond to the bottom portion of the recess portions 30, and the bottom surface of the stepped portion corresponds to the bottom surface of the recess portion 30. The depth of the recess portions 30, i.e., the height H of the stepped portions is set at 0.30 μm. Thereafter, the body 10 as a whole including the recess portions 30 are oxidized. As a result, a first layer 21 made of $SiO_2$ is formed (see FIG. 3A). The thickness $T_1$ of the first layer 21 on the top portion of the stepped portion is 20 nm. The oxidization conditions by, for example, a dry heating oxidizing method are exemplified as follows:

| Oxidizing atmosphere: | dry oxygen |
|---|---|
| Oxidizing temperature: | 1,000° C. |
| $T_1$: | 20 nm |

[Step-210]

Next, an ion-injection is effected to the bottom portion of each recess portion 30 to form a channel stop region on the bottom portion of the recess portion 30, if necessary. Thereafter, a second layer 22 having a higher polishing rate than that of the first layer 21 is formed to cover the stepped portion (see FIG. 3C). In the second embodiment, the second layer 22 is formed of a BPSG layer. The BPSG layer is basically formed under the similar conditions to those of [Step-120] of the first embodiment. A thickness of the second layer 22 at the bottom portion of the stepped portion (recess portion 30) is set at 0.60 μm. Namely, a height $T_2$ of the surface of the second layer 22 from the bottom surface of the stepped portion (bottom surface of the recess portion 30) is 0.62 μm (=0.02 μm+0.60 μm). Accordingly, a relationship $T_2$ (=0.62 μm)>(H+$T_1$) (0.32 μm=0.30 μm+0.02 μm) is met.

[Step 220]

Thereafter, the second layer 22 is polished to the first layer 21 formed on the body 10 corresponding to the top portion of the stepped portion (see FIG. 3C) in the same method as that of [Step-130] of the first embodiment.

[Step 230]

Figure 3A:
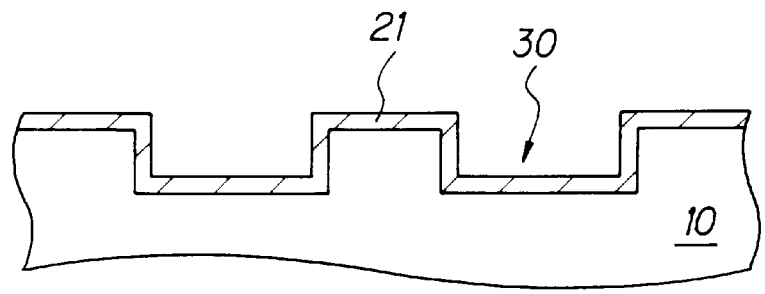
FIGS. 3A, 3B, 3C and 3D are schematic partial cross-sectional views showing a body and so on for illustrating each step of a layer planarizing method for a semiconductor device according to a second embodiment.
Figure 3B:
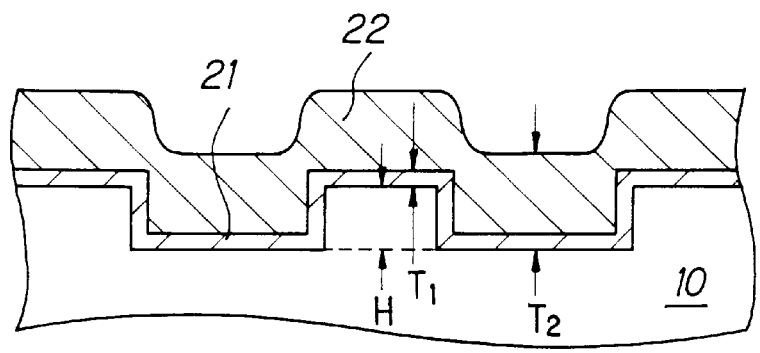
Figure 3C:
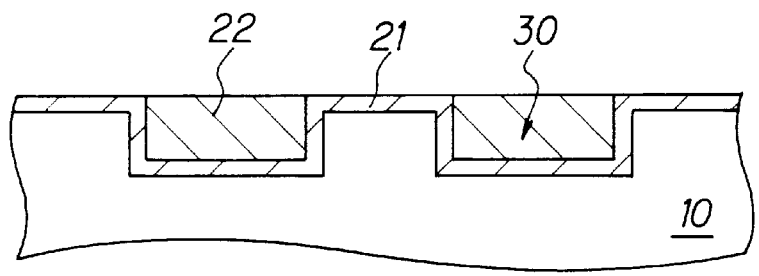
Figure 3D:
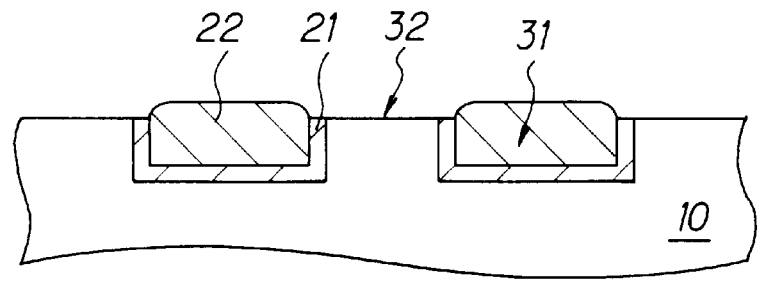

Subsequently, the first layer 21 left on the surface of the body 10 is removed by using, for example, diluted fluorine acid of 0.5%. As schematically shown in FIG. 3D, each isolation region 31 is formed in which the second layer 22 made of BPSG is embedded in the recess portion 30 and the substantially planarized trench structure is present on the surface. On the other hand, for instance, a region 32 which is to form a semiconductor element (semiconductor element forming region) is formed between the isolation regions 31. Incidentally, the first layer 21 which is left on the surface of the body 10 may be removed by the polishing method.

Thus, each isolation region 31 having the trench structure formed in accordance with the second embodiment is composed of the recess portion 30 formed in the body 10, the first layer 21 formed on the bottom surface and the side walls of the recess portion 30, and the second layer 22 embedding the recess 30.

Figure 22C:
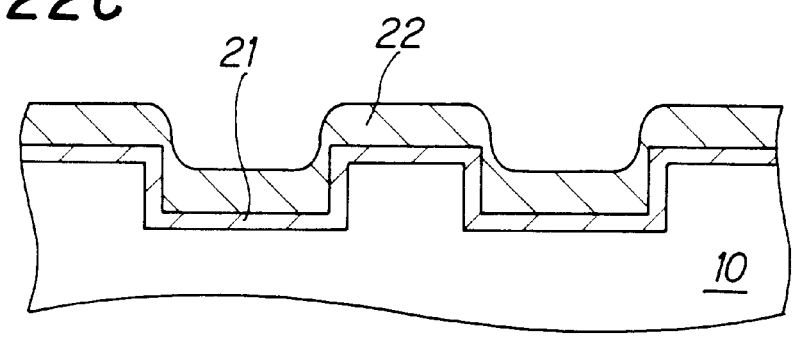
Figure 22D:
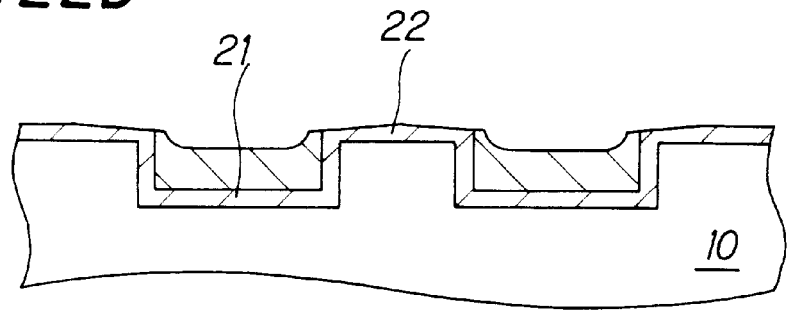

Incidentally, as shown in FIG. 22C, in the case where the value of $T_2$ is much smaller than the value of H+$T_1$, there is a fear that the second layer 22 over the bottom portion of the stepped portion would not be polished in Step-230 as shown in FIG. 22D.

Third Embodiment

Figure 4A:
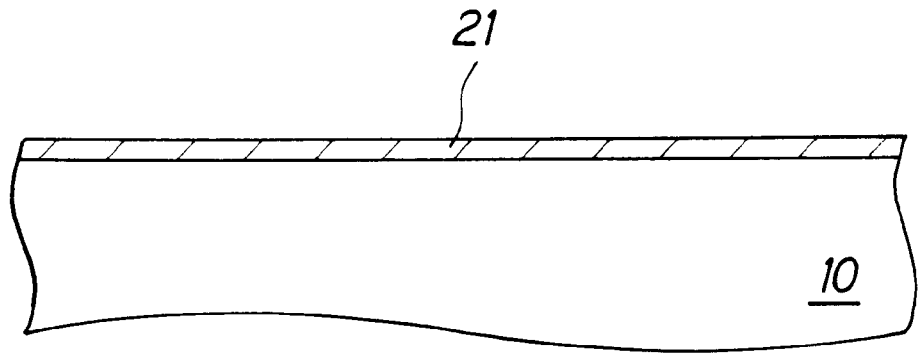
FIGS. 4A, 4B and 4C are schematic partial cross-sectional views showing a body and so on for illustrating each step of a layer planarizing method for a semiconductor device according to a third embodiment.
Figure 4B:
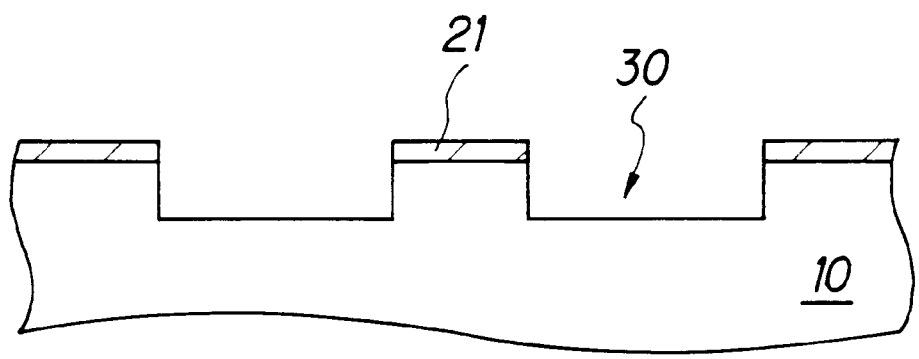
Figure 4C:
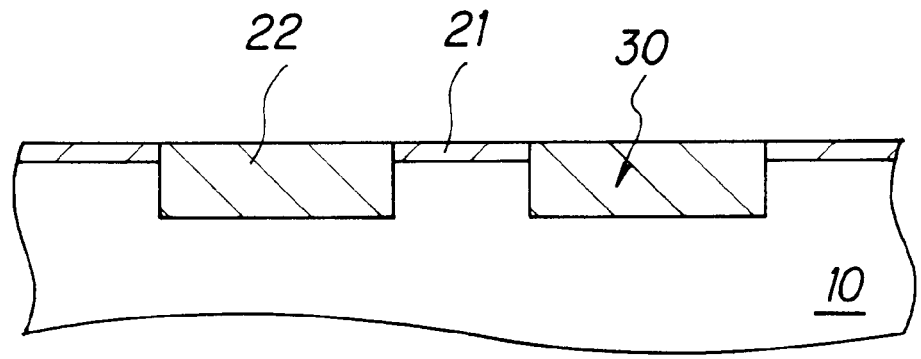

A third embodiment is a modification of the second embodiment and is different from the second embodiment in formation of the stepped portion (recess portion 30) and formation of the first and second layers. Namely, as schematically shown in partial cross-section in FIG. 4A, the first layer 21 is formed only on the surface of the body 10. The first layer 21 may be made of silicon oxide ($SiO_2$) or silicon nitride ($Si_3N_4$) deposited by, for example, the CVD method. Subsequently, the first layer and the body 10 are selectively etched to form stepped portions constituted by recess portions 30 in the body 10 by using a photolithographic technique and an etching technique (see FIG. 4B). The first layer 21 is formed only on the surface of the body 10. Namely, the first layer 21 is formed only on the top portions of the stepped portion provided on the body 10.

Thereafter, a second layer 22 is formed in the similar method to that of [Step-120] of the first embodiment, and the second layer is polished in the similar manner to [Step-130] of the first embodiment to expose the first layer 21 formed on the body 10 corresponding to the top portion of the stepped portion. Subsequently, in the similar method to [Step-230] of the second embodiment, the first layer 21 left on the surface of the body 10 is removed. Incidentally, in the case where the first layer 21 is made of silicon nitride, the first layer 21 may be removed by using phosphate kept at 140° C.

Incidentally, in the case where the second layer 22 is made of, for example, BPSG, there is a fear that impurities would be diffused from the second layer 22 to the body. In order to avoid this fear, the second layer 22 may be composed of two layers, i.e., polycrystalline silicon and BPSG.

Fourth Embodiment

A fourth embodiment is also a modification of the second embodiment and is different from the second embodiment in formation of the stepped portions (recess portions 30) and formation of the first layer parts 21A and 21B. The fourth embodiment will now be described with reference to FIG. 5A to 5C which are schematically, partial cross-sectional views showing the body and the like.

[Step-400]

Figure 5A:
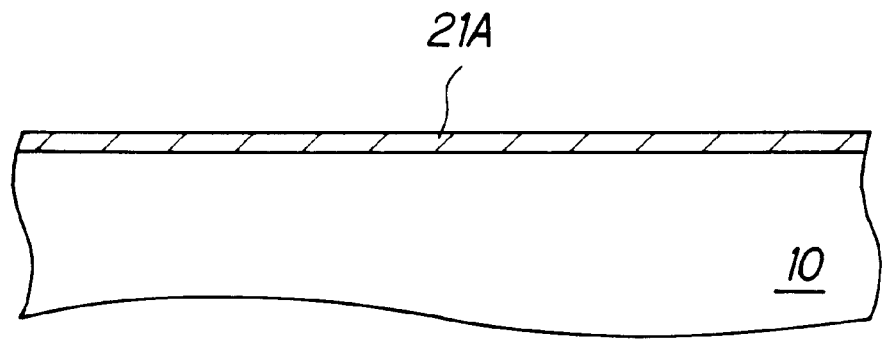
FIGS. 5A, 5B and 5C are schematic partial cross-sectional views showing a body and so on for illustrating each step of a layer planarizing method for a semiconductor device according to a fourth embodiment.
Figure 5B:
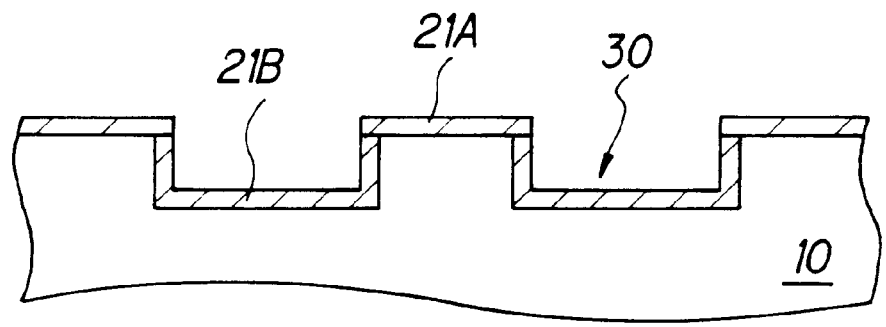

As shown in a schematic partial cross-section in FIG. 5A, the first layer part 21A is formed on the surface of the body 10. Namely, first of all, an oxide layer ($SiO_2$) is formed on the body 10 made of a silicon semiconductor body. The oxide layer may be formed by a byrogenic method under the following condition.

Oxidizing atmosphere: $O_2/H_2=4/1$

Oxidizing temperature: 850° C.

Next, an upper layer made of silicon nitride ($S_3N_4$) is deposited on the oxide layer by a CVD method. Thus, the part 21A of the first layer composed of an oxide layer ($SiO_2$) and the upper layer ($S_3N_4$) is formed.

[Step-410]

Thereafter, the part 21A made of silicon nitride is selectively removed out of the first layer by using a photolithographic technique and an etching technique. Subsequently, the oxide layer and the body 10 are selectively etched by using the upper layer made of silicon nitride as a mask. Thus, each recess portion 30 which is the stepped portion is formed in the body 10. Next, the recess portion 30 is oxidized by, for example, a thermal oxidizing method so that the oxide layer ($SiO_2$) is formed on the bottom surface and the side walls of the recess portion 30 (see FIG. 5B). The thermal oxidizing conditions are exemplified as follows.

Oxidizing atmosphere: dry oxygen

Oxidizing temperature: 1,000° C.

Thus, the first layer 21A and 21B are formed. Incidentally, the first layer 21A in the top portion of each stepped portion is formed of the oxide layer and the upper layer, and the first layer 21B in the bottom portion of the stepped portion is formed of oxide layer. Incidentally, the first layer 21A serves as a polishing stopper to improve the uniformity in polishing. Also, the first layer 21B functions to prevent the impurities from being diffused toward the body 10 from the second layer 22 made of, for example, BPSG.

[Step-420]

Figure 5C:
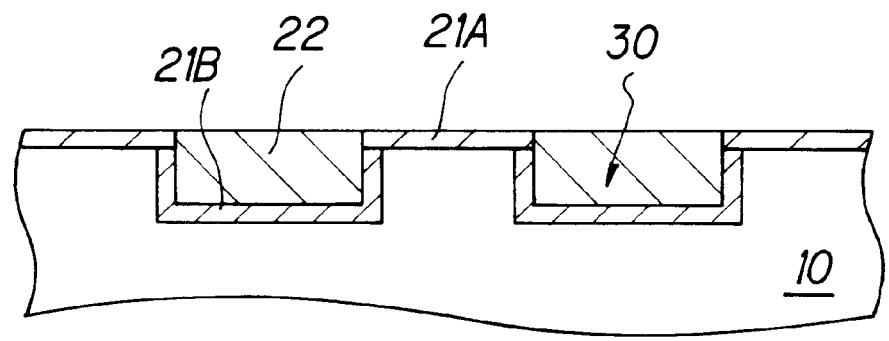

Thereafter, the second layer 22 is formed in the same method as [Step-120] of the first embodiment, the second layer is polished in the same method as [Step-130] expose the first layer 21 formed on the body 10 corresponding to the top portion of the stepped portion (see FIG. 5C).

[Step-430]

Next, the first layer 21A left on the surface of the body 10 is removed in the same manner as in [Step-230] of the second embodiment. Incidentally, the silicon nitride ($Si_3N_4$) constituting the first layer 21A is removed by phosphorous acid kept at a temperature of 140° C. Also, the silicon oxide ($SiO_2$) forming the first layer 21A is removed by using diluted fluorine acid of 0.5%.

Fifth Embodiment

A fifth embodiment is a modification of the fourth embodiment and is different from the fourth embodiment in step corresponding to [Step-430] of the fourth embodiment. Also, a material which is used to form the second layer 22 is polycrystalline silicon (poly-silicon). This difference will now be described with reference to FIGS. 6A to 6C.

[Step-500]

Figure 6A:
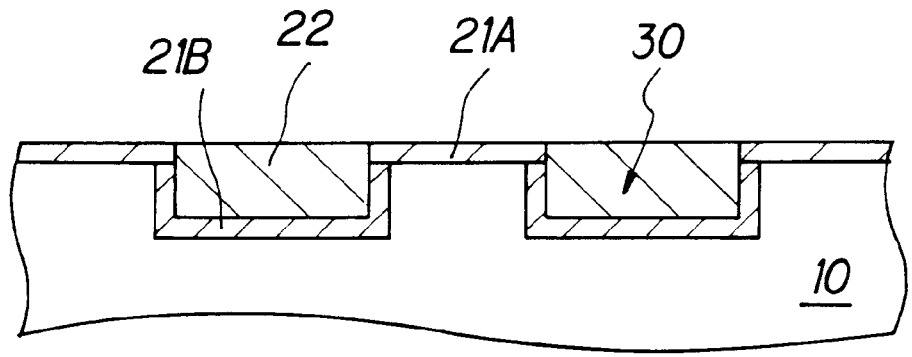
FIGS. 6A, 6B and 6C are schematic partial cross-sectional views showing a body and so on for illustrating each step of a layer planarizing method for a semiconductor device according to a fifth embodiment.
Figure 6B:
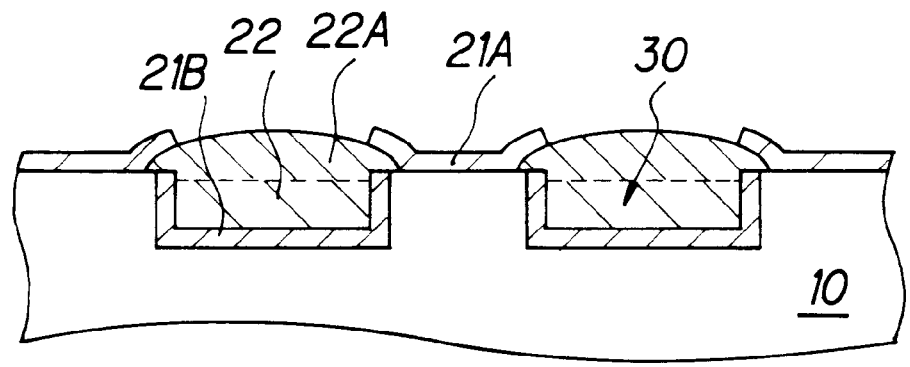

In the same method as [Step-400] to [Step-420] of the fourth embodiment, the second layer 22 and the first layer 21B are embedded in the recess portion 30, i.e. stepped portion to form an element isolation region (see FIG. 6A). Incidentally, the second layer 22 made of polycrystalline silicon may be deposited by a CVD method at a heating temperature 610° C. of the body by using $SiH_4$ gas.

[Step-510]

Next, the surface of the second layer 22 made of polycrystalline silicon is oxidized to form an oxide layer 22A ($SiO_2$) on the surface of the second layer 22. Incidentally, since the first layer 21A is left, the surface of the body 10 made of the silicone semiconductor body is oxidized. The thickness of the oxide layer 22A is about 0.10 µm. The oxide layer 22A may be formed by a byrogenic method under, for example, the following conditions.

Oxidizing atmosphere: $O_2/H_2=4/1$

Oxidizing temperature: 950° C.

[Step-520]

Figure 6C:
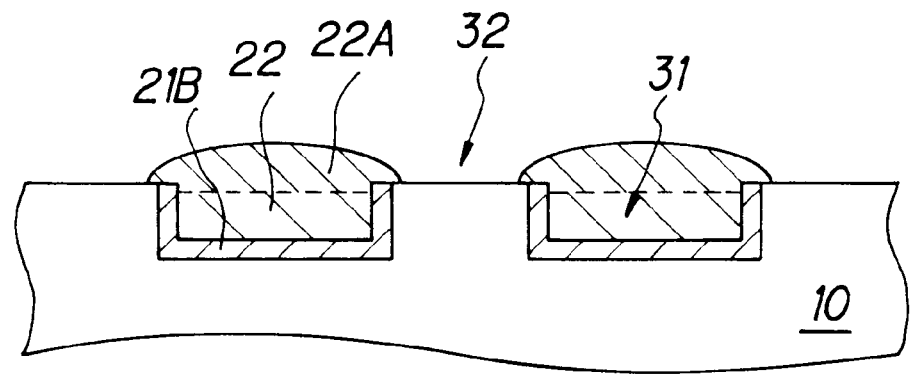

Thereafter, the first layer 21A left on the surface of the body 10 is removed in the same manner as in [step-430] of the fourth embodiment (see FIG. 6C). Thus, each isolation region 31 having a trench structure is formed, and on the other hand, a region 32 where, for example a semiconductor element is to be formed is formed between the element isolation regions 31.

Thus, the isolation region 31 having the trench structure formed in accordance with the fifth embodiment is composed of a recess portion 30 formed in the body 10, the first film 21B formed on the bottom surface and the side walls of the recess portion 30, the second layer 22 filling the recess portion 30 and the oxide layer 22A formed on the surface portion of the second layer 22.

The polishing rate of the second layer 22 made of polycrystalline silicon is about twenty times higher than the polishing rate of the first layer 21 made of silicon oxide ($SiO_2$), and hence a satisfactory selectivity may be insured.

Incidentally, in the first through fifth embodiments, it is sufficient that the first layer 21 is made of material having a lower polishing rate than that of the second layer 22. For instance, the first layer 21 may be formed of silicon nitride. Alternatively, the first layer 21 may be composed of two layers made of silicon oxide and silicon nitride. The second layer 22 may be composed of two layers made of silicon oxide containing impurities and polycrystalline silicon. The first and second layers are made of such material, so that the polishing rate of the second layer 22 is much higher than that of the first layer 21.

Sixth Embodiment

A sixth embodiment is related to the planarizing method in accordance with the second aspect of the invention. In the sixth embodiment, it is intended to planarize an insulating layer to be formed between interconnection layers in the same way as the first embodiment. In the sixth embodiment, a base is made of a semiconductor body, and stepped portions are formed of interconnections formed on the body. A first layer and a third layer are made of silicon oxide ($SiO_2$), and a second layer is made of silicon oxide containing impurities (i e., BPSG). The first layer is formed not only on a top portion of each stepped portion but also on side walls and bottoms thereof. The third and second layers are to be polished by the chemical mechanical polishing method (CMP method). Also, the first layer is used as polishing stoppers not only to improve the uniformity of the polishing effect but also to have a practical function to prevent impurities from being diffused into the body from the second layer made of, for example, BPSG.

The layer planarizing method according to the sixth embodiment will now be described with reference to FIGS. 7A to 7D which schematically shows the body and the like.

[Step-600]

First of all, interconnection layers 14 are formed on a base 10 made of a silicon semiconductor body in the same way as [Step-100] of the first embodiment (see FIG. 7A). Incidentally, the interconnection layers 14 are gate electrodes of MOS type transistors or extension parts of the gate electrodes. A height H of each stepped portion is 0.21 µm.

[Step-610]

A first layer 41 is formed at least on a top portion of each stepped portion provided in the body 10. In the sixth embodiment, the first layer 41 is formed not only on the top portion of each interconnection layer 14, i.e., stepped portion but also on the bottom of the stepped portion. Namely, the first layer 41 is formed over the entire surface of the body 10 including the top portion of the interconnection layers 14. The first layer 41 is formed of silicon oxide ($SiO_2$) which may be deposited by a plasma CVD method using, for example, tetraethoxysilane (TEOS). A thickness $T_1$ of the first layer 41 at the top portion of each stepped portion is set to 0.20 μm. Deposition conditions for the film formation of the first layer 41 may be basically the same as those described above in connection with [Step-110] of the first embodiment.

[Step-620]

Next, a second layer 42 having a higher polishing rate than that of the first layer 41 is formed to cover each stepped portion so that the a height $T_2$ from the bottom surface of the stepped portion (i.e., surface of the body 10) to the surface of the second layer 42 is somewhat lower than or substantially equal to ($H+T_1$) (see FIG. 7B). In the sixth embodiment, the second layer 42 is formed of a BPSG layer deposited by, for example, a low-pressure CVD method. A thickness of the second layer 42 at the bottom portion of the stepped portion is set at 0.23 μm. Namely, the height $T_2$ of the surface of the second layer 42 from the bottom surface of the stepped portion is 0.43 μm (=0.20 μm+0.23 μm). Accordingly, a value of $T_2$ (=0.43 μm) is essentially the same as a value of ($H+T_1$) (0.41 μm=0.21 μm+0.20 μm). Furthermore, a relationship, $T_2-(H+T_1) \leq 0.1$ μm is met. Incidentally, it is preferable to reflow the second layer 42 made of BPSG, for example, at a temperature of 900° C. for 20 minutes in a nitrogen gas atmosphere after the formation of the second layer 42.

[Step-630]

Thereafter, a third layer 43 having a thickness 50 nm and a lower polishing rate than that of the second layer 42 is formed on the surface of the second layer 42 (see FIG. 7C). Namely, a height $T_3$ from the bottom surface of the stepped portion (surface of the body) to the surface of the third layer 43 is 0.48 μm. The third layer 43 is formed of a non-doped silicate glass (NSG film which contains silicon oxide $SiO_2$) by a low pressure CVD method in which $SiH_4$ gas is used and a heating temperature of the body is kept at 410°. Alternatively, the third layer 43 may be formed into a silicon oxide layer by a plasma CVD method using tetraethoxysilane (TEOS). Incidentally, the thickness of the third layer 43 meets a relationship, $|T_3-(H+T_1)| \leq 0.1$ μm. Also, the third layer 43 may be made of silicon nitride ($Si_3N_4$).

[Step-640]

Thereafter, the second layer 42 is polished by the polishing method until the surface of the first layer 41 formed over the interconnection layers 14 is exposed (see FIG. 7D). The polishing is based upon a chemical mechanical polishing method (CMP method). Under the polishing conditions, for instance, a piece of cloth SUBA800 (for example, about 80 to 100 in hardness Asker-C) is used as a polishing cloth, and a fumed silica having a suitable composition is used as a polishing liquid. Also, the polishing is carried out under the condition that the feed amount of the polishing liquid, the polishing pressure and the rotating speed of a spinning base are set at 4 $cm^3$/min, 200 $g/cm^2$ and 40 rpm. It is also possible to polish the third layer 43 and the second layer 42 by the mechanical polishing method described in conjunction with Step-130 of the first embodiment.

Thus, the first layer 41 is left on the top portion of the interconnection layer, i.e., the stepped portion. A laminated film composed of the first layer 41, the second layer 42 and the third layer 43 is formed on the body 10 on the bottom portion of the stepped portion. The surface of the first layer 41 at the top portion of the interconnection layer 14, i.e., the stepped portion is substantially flush (i.e kept at the same level) with the surfaces of the second and third layers 42 and 43 above the bottom portion of the stepped portion.

Namely, the interconnection structure formed in accordance with the sixth embodiment is composed of a plurality of interconnection layers formed on the body 10, the first layer 41 formed at the top portion of these interconnection layers 14, and the second layer 42 and the third layer 43 laminated on the body 10 between the interconnection layers 14 with the surfaces of the first layer 41, the second layer 42 and the third layer 43 being flush with each other and the second layer being exposed between the first layer 41 and the third layer 43.

The polishing rate of the first layer 41 and the third layer 43 which are made of silicon oxide, is 12 nm/min., and on the other hand, the polishing rate of the second layer 42, which is made of BPSG, is 100 nm/min. Accordingly, the polishing rate of the second layer 42 is about eight times higher than the polishing rate of the first layer 41 and the third layer 43, and hence a satisfactory selectivity may be insured. Namely, the second layer 42 is easier to polish than the first and third layers 41 and 43. Accordingly, when the polishing of the third layer 43 and the second layer 42 over the interconnection layers 14, i.e., stepped portions proceeds and when or immediately before the first layer 41 over the top portions of the interconnection layers 14, i.e., convex portions which form projections, is exposed, the third layer 43 over the bottom portions of the stepped portions is started to be polished. Accordingly, the third layer 43 above the first layer 41 over the top portions of the stepped portions and the third layer 43 over the top portions of the stepped portions functions as a polishing stopper. Namely, the polishing speed is controlled at part of the second layer 42 between the first layer 41 above the top portions of the stepped portions and the third layer 43 above the top portions of the stepped portions.

Figure 23A:
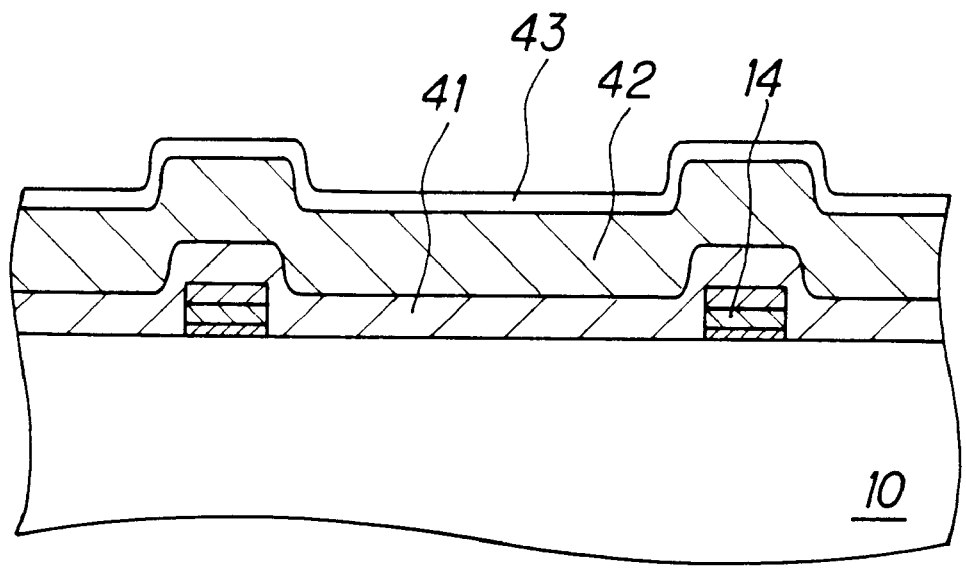
FIGS. 23A and 23B are schematic partial cross-sectional views of a body and so on showing problems caused in the case where unsuitable layer thicknesses are selected for a second layer in the sixth embodiments.
Figure 23B:
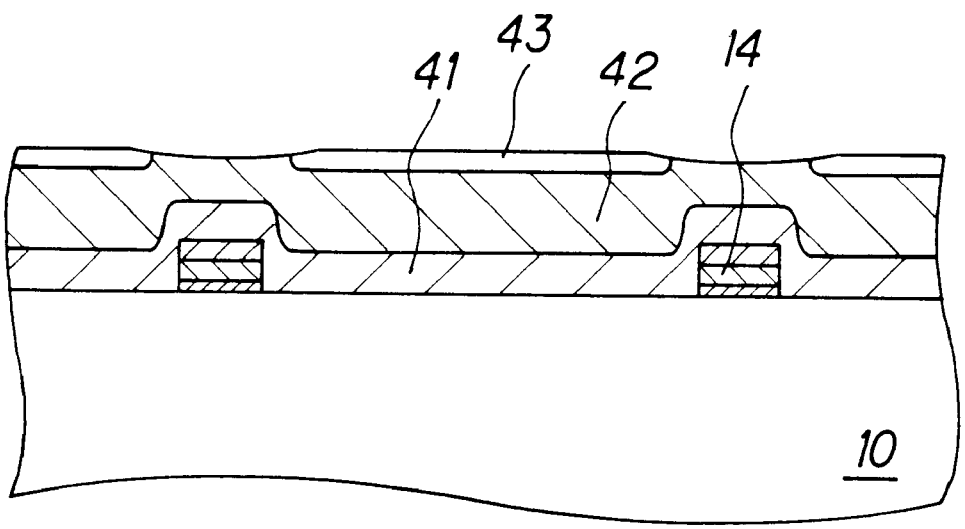
Figure 24A:
FIGS. 24A, 24B, 24C and 24D are schematic partial cross-sectional views showing a body and so on for illustrating an outline of a conventional polishing and planarizing technique.
Figure 24B:
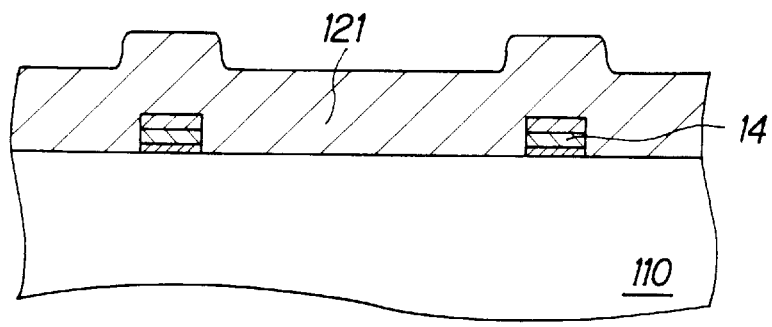
Figure 24C:
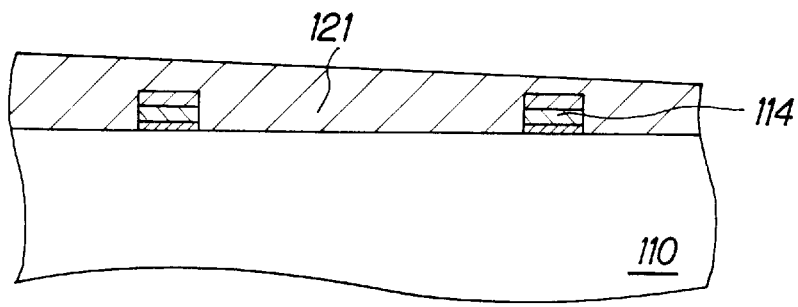
Figure 24D:
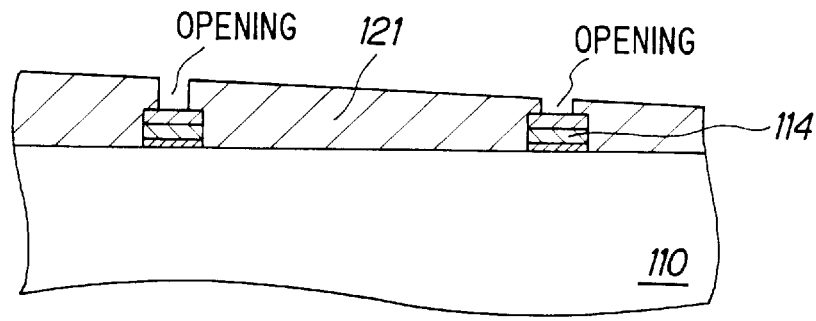
Figure 25A:
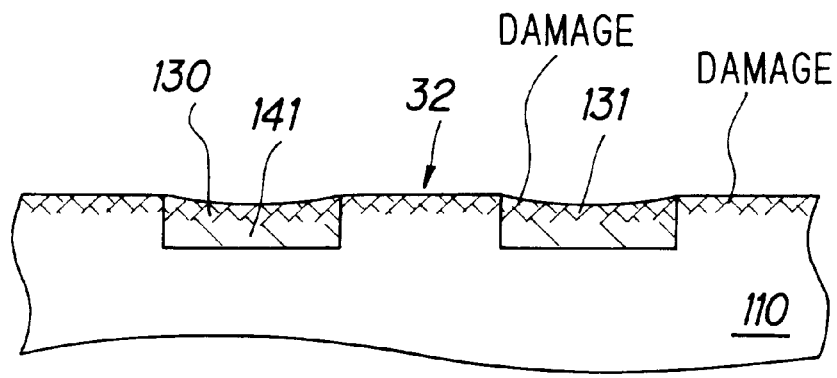
FIGS. 25A, 25B and 25C schematic partial cross-sectional views showing a body and so on for illustrating problems caused by a conventional trench element isolation region forming method by using a CMP method.
Figure 25B:
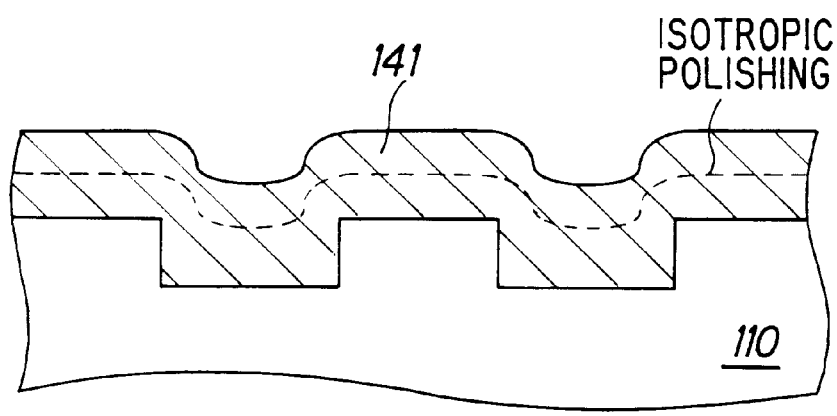
Figure 25C:
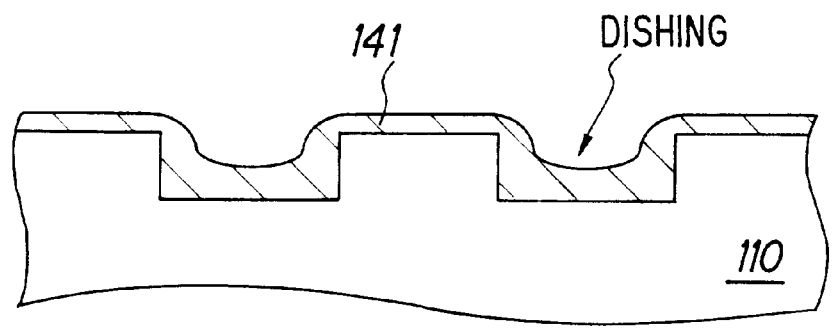

With the first layer 41 and the third layer 43, which have a lower polishing rate, used as a polishing stopper, the third layer 43 and the second layer 42 are polished until the first layer 41 over other interconnection layers 14 is exposed. In this way, polishing is performed until the first layer 41 over all or almost all the interconnection layers 14 formed on the wafer is exposed. Alternatively, the polishing is terminated when all or almost all the third layer 43 appears on the uppermost part of the bottom portions of the stepped portions formed on the body 10. Thus, the sum in thicknesses of the first, second and third layers 41, 42 and 43 at the bottom portions of the stepped portions is made uniform in the wafer surface. As a result, planarizing of the layer in the wafer surface is generally realized. Incidentally, as shown in FIG. 23A, in the case where the value of $T_2$ is much larger than the value of $H+T_1$, there is a fear that polishing of each layer would be insufficient and the flatness would be unsatisfactory in Step-640 as shown in FIG. 23B.

Incidentally, in the sixth embodiment, the first layer 41 and the third layer 43 are formed of silicon oxide, and the second layer 42 is formed of BPSG. However, it is sufficient that the first layer 41 and the third layer 43 are made of material having a lower polishing rate than that of the second layer 42. For example, the first layer 41 and the third layer 43 may be formed of silicon nitride. Alternatively, each of the first layer 41 and the third layer 43 may be made of two layers of silicon oxide and silicon nitride. Furthermore, instead of forming the second layer 42 of silicon oxide containing impurities, it is possible to form the second layer 42 of polycrystalline silicon. Otherwise, the second layer 42 may be made of two layers of silicon oxide containing impurities and polycrystalline silicon. The first, second and third layers are made of such material so that the polishing speed of the second layer 42 is much lower than that of the first layer 41, and the polishing speed of the third layer 43 is much lower than that of the second layer 42.

Next, the above-described polishing mechanism of the sixth embodiment will be explained with reference to FIGS. 8A to 8C and FIGS. 9A and 9B, which shows the polishing process sequence, and to FIG. 10, which is graph showing the relationship between the surface height and the polishing time. Curves A, B, C and D in FIG. 10 show the height of each layer at positions A, B, C and D in FIGS. 8A to 8C and FIGS. 9A and 9B. Incidentally, the ordinate axis in FIG. 10 shows the surface height, and the abscissa axis shows the polishing time. It should be noted that the height is based upon the surface of the body 10.

Figure 8A:
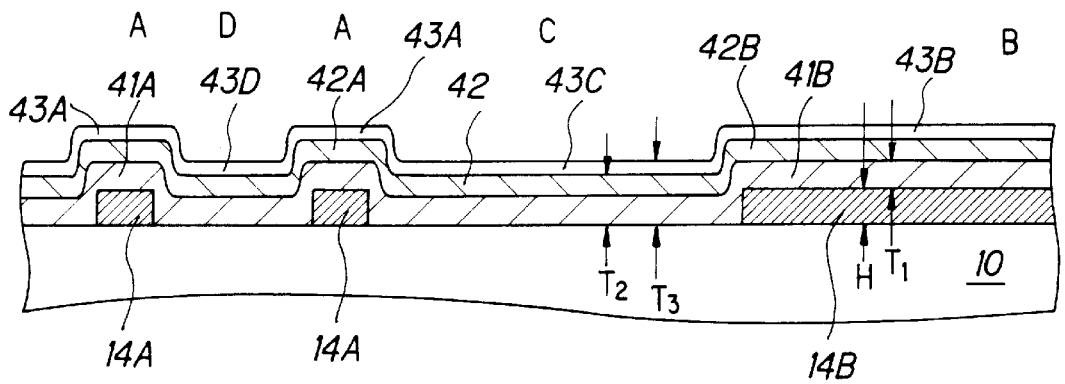
FIGS. 8A, 8B and 8C are schematic partial cross-sectional views showing a body and so on for illustrating further each step of the polishing method for the semiconductor device according to the sixth embodiment.
Figure 8B:
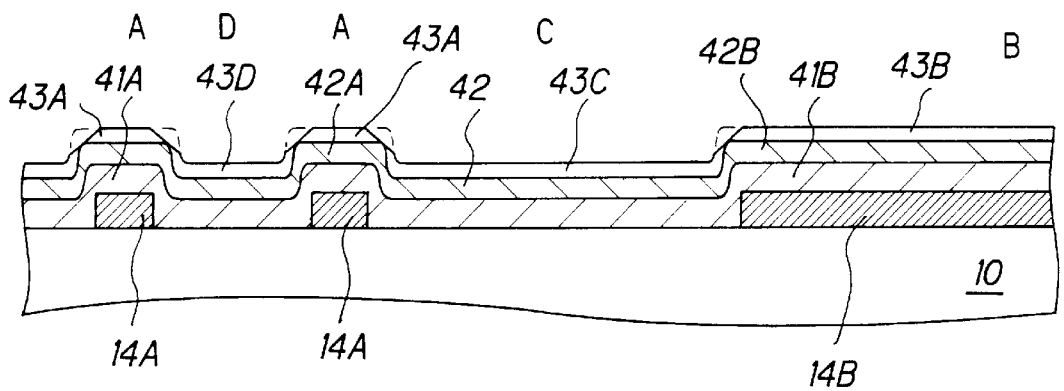

As shown in FIG. 8A, a body 10 has interconnections 14 formed thereon. A first layer 41 is formed on the surface of the body 10. Incidentally, a part of the first layer on the top portion of a narrow interconnection layer 14A (corresponding to a region A) is designated by reference character 41A. A part of the first layer on the top portion of a wide interconnection layer 14B (corresponding to a region B) is designated by reference character 41B. A second layer 42 having a higher polishing rate than that of the first layer 41 is formed on the surface of the first layer 41. The second layer 42 is formed so that a value of $T_2$ is smaller than or substantially equal to a value of $(H+T_1)$. Incidentally, a part of the second layer on the top portion of the narrow interconnection layer 14A (corresponding to the region A) is designated by reference character 42A. A part of the second layer on the top portion of the wide interconnection layer 14B (corresponding to the region B) is designated by reference character 42B. Furthermore, a third layer 43 having a lower polishing rate than at least that of the second layer 42 is formed on the surface of the second layer 42. Incidentally, a part of the third layer on the top portion of the narrow interconnection layer 14A (corresponding to the region A) is designated by reference character 43A. A part of the third layer on the top portion of the wide interconnection layer 14B (corresponding to the region B) is designated by reference character 43B. A third layer formed above a wide bottom portion (corresponding to a region C) of the stepped portion is designated by reference character 43C. A third layer formed above a narrow bottom portion (corresponding to a region D) of the stepped portion is designated by reference character 43D.

In particular, the third layer 43C is formed so that a height of the surface of the third layer 43C formed in the space between the interconnections 14 is approximately equal to a height of the surface of the first layer 41A and 41B formed over the interconnections 14. Incidentally, the heights of respective surfaces of layers under this condition are kept so that the regions A and B have a height $h_3$ (=H+$T_3$), and the regions C and D have a height $h_1$ (=$T_3$). Incidentally, a height $h_2$ is equal to H+$T_3$.

Under such conditions, polishing is carried out. As shown at in FIG. 8B, at an initial stage of polishing, ridge portions (shown by the broken line) of the third layer 43A, 43B are mainly polished. At this stage, almost no polishing is effected on the third layer 43C in the region C or the third layer 43D in the region D. The third layer 43A in the region A is subjected to a strong polishing pressure component in a direction perpendicular to the surface of the body 10 in comparison with the polishing pressure component applied to the third layer 43B in the region B. Therefore, the polishing rate at the third layer 43A in the region A is higher than that at the third layer 43B in the region B.

Figure 8C:
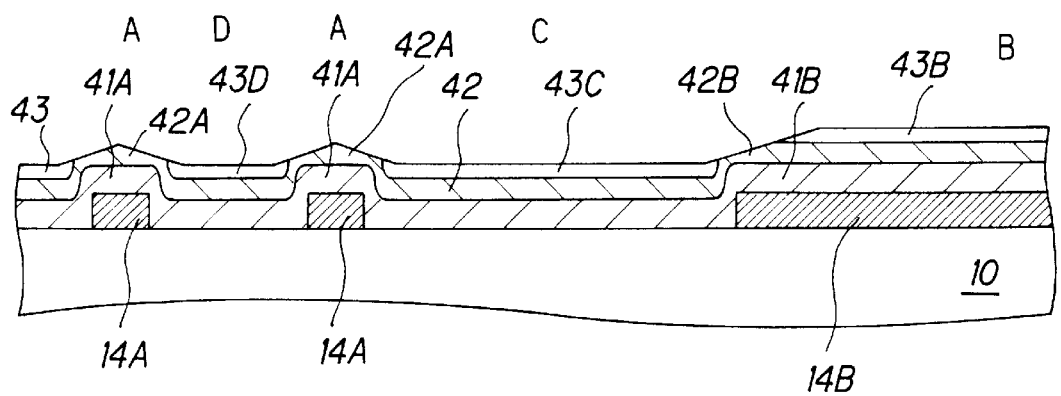

As the polishing further proceeds, as shown in FIG. 8C, the third layer 43A in the region A over the interconnections 14 and the second layer 42A therebelow is started to be polished in an angular shape. Furthermore, the second layer 42B in the vicinity of the third layer 43B which has been started to be thus polished is also obliquely polished. This stage is indicated by time $t_A$ in FIG. 10.

Figure 9A:
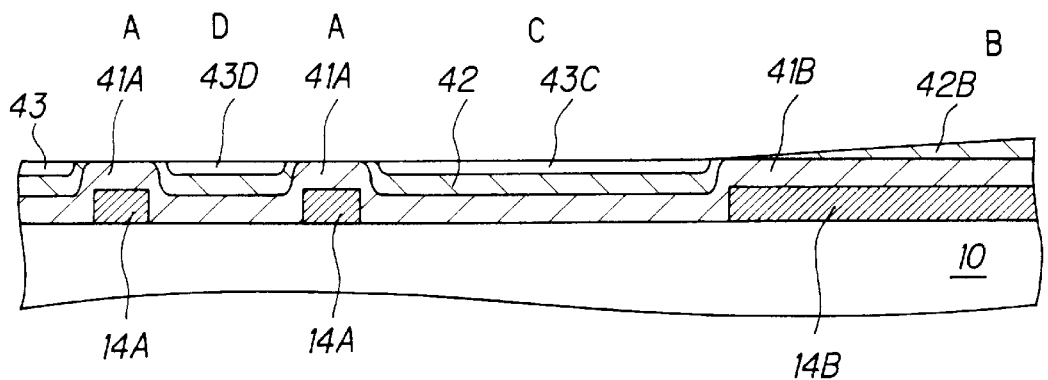
FIGS. 9A and 9B are schematic partial cross-sectional views showing a body and so on for illustrating still further each step of the polishing method for the semiconductor device according to the sixth embodiment.
Figure 9B:
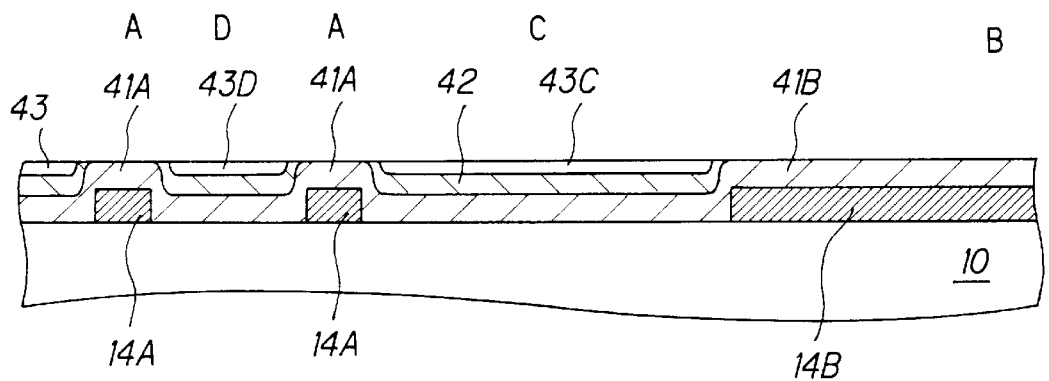
Figure 10:
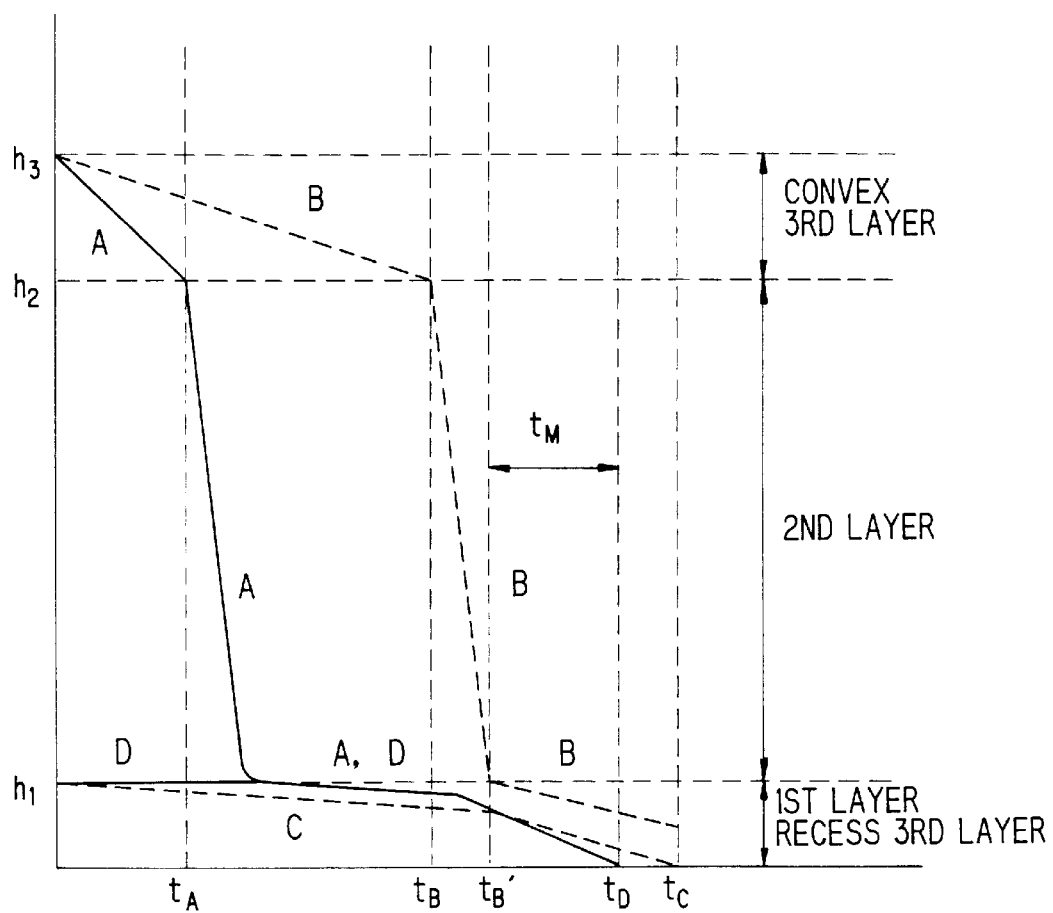
FIG. 10 is a graph showing a relationship between a height of each layer surface and a polishing time therefor in the sixth embodiment.

As the polishing further proceeds, as shown in FIG. 9A, the third layer 43B in the region B is further polished and eliminated. Also, the considerable amount of the second layer 42B in the region B is also polished out. Consequently, the surface of the first layer 41A in the region A formed over the interconnections 14 is exposed. At this time, since the upper surface of the first layer 41A in the region A is substantially flush with the upper surface of the third layer 43C over the wide bottom portion of the stepped portion (in the region C) and the upper surface of the third layer 43D over the narrow bottom portion of the stepped portion (in the region D), the third layer 43C in the region C, the third layer 43D in the region D and the first layer 41A in the region A serve as polishing stoppers. As a result, the polishing is stopped substantially at the level defined by the upper surface of the first layer 41A, the upper surface of the third layer 43C and the third layer 43D. This stage is shown by a point of time $t_B$ in FIG. 10.

However, at this time, a substantial amount of the second layer 42B over the interconnection 14B (region B) where the interconnection width is relatively large is left. Accordingly, the polishing is continued further to remove the remaining second layer 42B (see FIG. 9A). At this time, since the first layer 41A and the third layers 43C, 43D which have been polished substantially at the same level as that of the first layer 41A serve as polishing stoppers, the second layer 42 exposed at the space between the interconnections 14 is hardly polished. Furthermore, since the first layer 41B over the top portion where the interconnection width of the interconnection 14B (region B) is relatively large Also acts as a polishing stopper, the first layer 41, the second layer 42 and the third layer 43 are made substantially flat. This stage is shown in a point of time $t_B'$ in FIG. 10.

If the polishing proceeds until the time $t_D$, the third layer 43D in the region D is polished away. Accordingly, the spare time $t_M$ for polishing control is given by a time difference $t_M=t_D-t_B'$. The time $t_B'$ is determined by the interconnection region having the largest interconnection width but may be in general kept constant if the interconnection width exceeds a predetermined level. On the other hand, the third layer 43D in the region D does not depends upon the interconnection width but is eliminated at a predetermined time $t_D$ by a polishing pressure component in a direction perpendicular to a surface of the body 10. If the polishing is further continued until the time $t_C$, the third layer 43c in the region C. Accordingly, the second layer 42 in the region C is polished in a concave. Hence, the flatness is degraded. Accordingly, as described above, the polishing time must be set in the range of from $t_D$ to $t_B'$.

In the planarizing method according to the sixth embodiment, it is preferable to meet the following relation:

$|T_3-(H+T_1)| \leq 0.1 \mu m$

If this relation is met, it is possible to keep a sufficient polishing allowance. Accordingly, the surfaces of the first, second and third layers, 41, 42 and 43 formed on the body 10 becomes substantially flat.

Modification of Sixth Embodiment

Figure 11A:
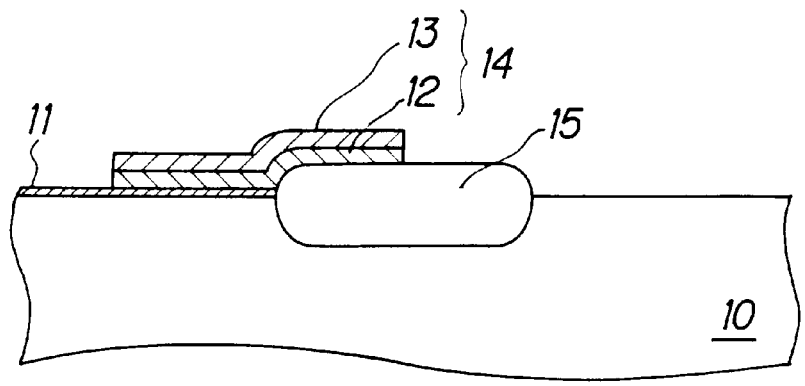
FIGS. 11A, 11B and 11C are schematic partial cross-sectional views showing a body and so on for illustrating each step of a layer planarizing method for a semiconductor device according to a modification of the sixth embodiment.

In a modification of the sixth embodiment, the body 10 is formed of a semiconductor body, and each stepped portion is constituted by the interconnection layer 14 formed on the element isolation region 15 having a LOCOS structure formed on the body (see FIG. 11A). Namely, the stepped portion is of double type. A first stepped portion is composed of an isolation region 15 having a LOCOS structure and a second stepped portion is composed of an interconnection layer 14.

Figure 11B:
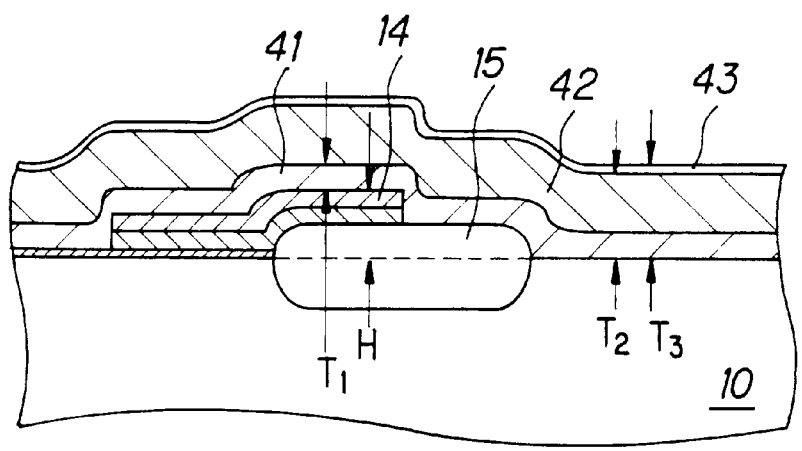
Figure 11C:
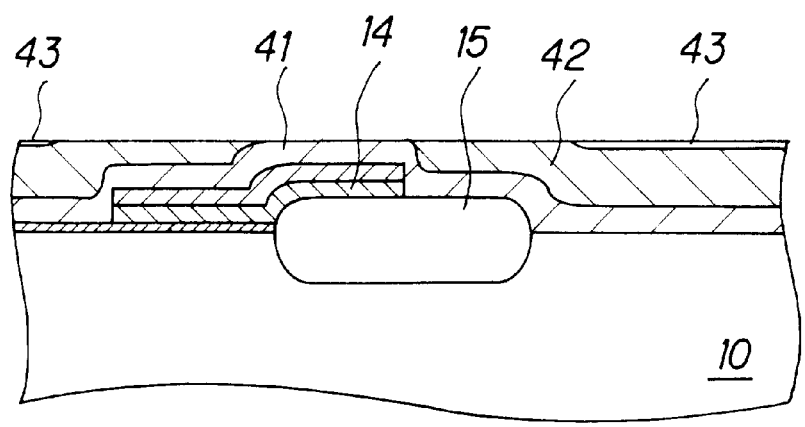
Figure 12A:
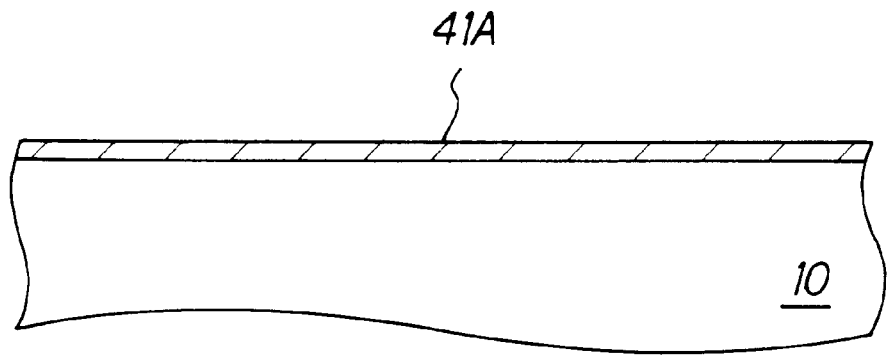
FIGS. 12A, 12B and 12C are schematic partial cross-sectional views showing a body and so on for illustrating each step of a layer planarizing method for a semiconductor device according to a seventh embodiment.
Figure 12B:
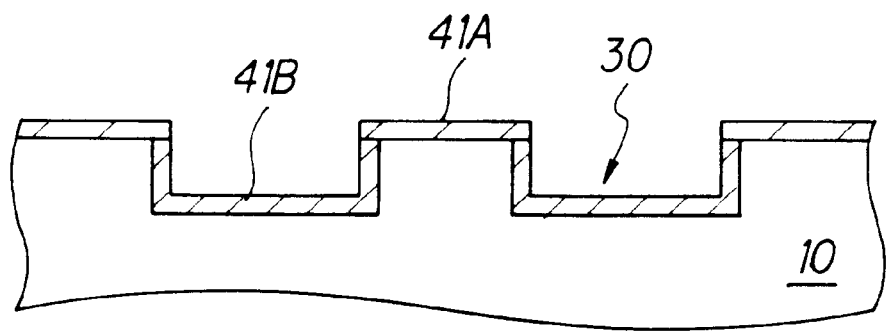
Figure 12C:
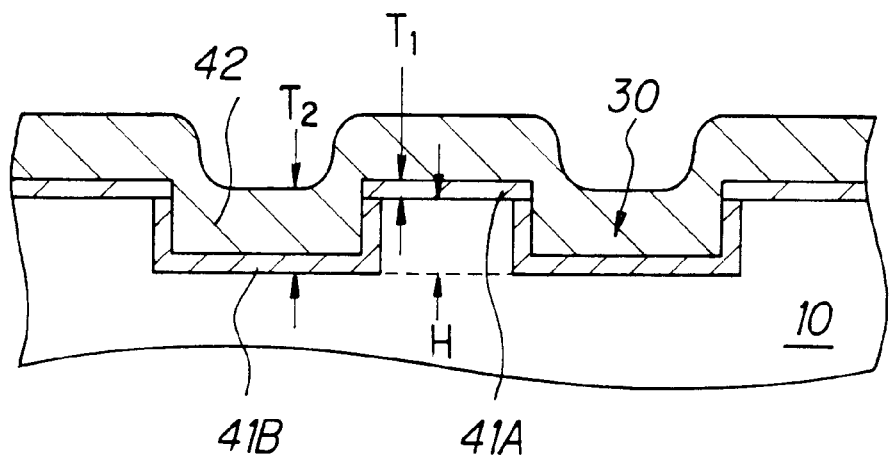

In the same manner as in the sixth embodiment, a first layer 41 and a third layer 43 are made of silicon oxide ($SiO_2$), and a second layer 42 is made of BPSG. The third and second layers 43 and 42 are to be polished by the chemical mechanical polishing method or a mechanical polishing method. The planarizing method which is the same as that of the sixth embodiment may be applied to the modification of the sixth embodiment, except for difference in the structure of the stepped portion. Accordingly, detailed explanation therefor will be omitted. FIGS. 11A, 11B and 11C are partial schematic cross-sectional view showing the body and the like in accordance with the modification of the sixth embodiment [Step-600A] (corresponding to [Step-600] of the sixth embodiment),[Step-630A] (corresponding to [Step-630] of the sixth embodiment), and [Step-640A] (corresponding to [Step-640] of the first embodiment).

Seventh Embodiment

A seventh embodiment is also related to the planarizing method in accordance with the second aspect of the invention. In the seventh embodiment, it is intended to planarize an insulating layer to be formed between interconnection layers in the same way as the fourth embodiment. In the seventh embodiment, a base is made of a semiconductor body, and stepped portions are formed of recess portions formed on the body. A first layer is made of silicon oxide ($SiO_2$) and silicon nitride, a second layer is made of silicon oxide containing impurities (i.e., BPSG) and a third layer is made of silicon oxide ($SiO_2$). The first layer is formed not only on a top portion of each stepped portion but also on side walls and bottoms thereof. The third and second layers are to be polished by the chemical mechanical polishing method (CMP method). Also, the first layer formed on the top surface of the stepped portion (surface of the body) is used as polishing stoppers to improve the uniformity of the polishing effect. The first layer formed on the bottom portion of the stepped portion (bottom of the recess portion) functions to have a practical function to prevent impurities from being diffused into the body from the second layer made of, for example, BPSG.

More specifically, the seventh embodiment relates to a third application of a layer planarizing method according to the second aspect of the invention. Namely, in the seventh embodiment, the process for forming the first layer having a thickness $T_1$ of the top portion of the stepped portion at least on the top portion of the stepped portion having a height H and formed on the body includes the steps of forming the stepped portion constituted by a recess in the body after forming an oxide layer and an upper layer on the body and subsequently forming an oxide layer on side walls and a bottom surface of the recess which forms the stepped portion. The first layer on the top portion of the stepped portion is composed of the oxide layer and the upper layer, and the first layer in the bottom portion of the stepped portion is composed of the oxide layer.

The layer planarizing method according to the seventh embodiment will now be described with reference to FIGS. 12A to 12C and FIGS. 13A to 13C which are schematic partial cross-sectional views showing the body and the like.

[Step-700]

First of all, in the same manner as [Step-400] in the fourth embodiment, a first layer part 41A is formed on the surface of the body 10. Namely, first of all, an oxide layer ($SiO_2$) having a thickness of 10 nm is formed on the body 10 made of a silicon semiconductor body. Subsequently, an upper layer having a thickness 0.15 $\mu$m and formed of silicon nitride ($Si_3N_4$) is formed on the oxide layer by a CVD method. Thus, the part 41A of the first layer composed of the oxide layer ($SiO_2$) and the silicon nitride ($Si_3N_4$) (see FIG. 7A).

[Step-710]

Thereafter, in the same method as [Step-410] of the fourth embodiment, the part 41A made of silicon nitride and the body 10 are selectively etched by using a photolithographic technique and an etching technique to form the recess portion 30 which is the stepped portion in the body 10. Subsequently, the recess portion 30 is oxidized by, for example, a thermal oxidizing method so that the oxide layer ($SiO_2$) having a thickness of 20 nm is formed on the bottom surface and the side walls of the recess portion 30 (see FIG. 7B).

Thus, the first layers 41A nd 41B are formed. Incidentally, the first layer 41A on the top portion of the stepped portion is composed of the oxide layer and the upper layer, and the first layer 41B in the bottom portion of the stepped portion is composed of the oxide layer. Tn the seventh embodiment, the first layer 41B is formed not only on the top portion of the recess portion 30 (surface of the body 10), which is the stepped portion, but also on the bottom portion of the stepped portion.

A height (depth) of the recess portion which is the stepped portion formed in the body 10 is 0.25 $\mu$m. Also, $T_1$ is 0.16 $\mu$m. Accordingly, the value of (H+$T_1$)is 0.41 $\mu$m.

[Step-720]

Next, a second layer 42 having a higher polishing rate than that of the first layer 41A is formed to cover each stepped portion so that the a height $T_2$ from the bottom surface of the stepped portion (i.e., surface of the recess portion 30) to the surface of the second layer 42 is somewhat lower than or substantially equal to (H+$T_1$) (see FIG. 11B). Tn the seventh embodiment, the second layer 42 is formed of a BPSG layer deposited by, for example, a low-pressure CVD method in the same manner as [Step-120] of the first embodiment. A thickness of the second layer 42 at the bottom portion of the stepped portion (i.e., bottom portion of the recess portion 30) is set at 0.30 $\mu$m. Namely, the height $T_2$ of the surface of the second layer 42 from the bottom surface of the stepped portion is 0.32 $\mu$m (=0.02 $\mu$m+0.30 $\mu$m). Accordingly, a value of $T_2$ (=0.32 $\mu$m) is smaller than a value of (H+$T_1$) (0.41 $\mu$m=0.25 $\mu$m+0.16 $\mu$m). It is preferable to reflow the second layer 42 made of BPSG, for example, at a temperature of 900° C. for 20 minutes in a nitrogen gas atmosphere after the formation of the second layer 42.

[Step-730]

Figure 13A:
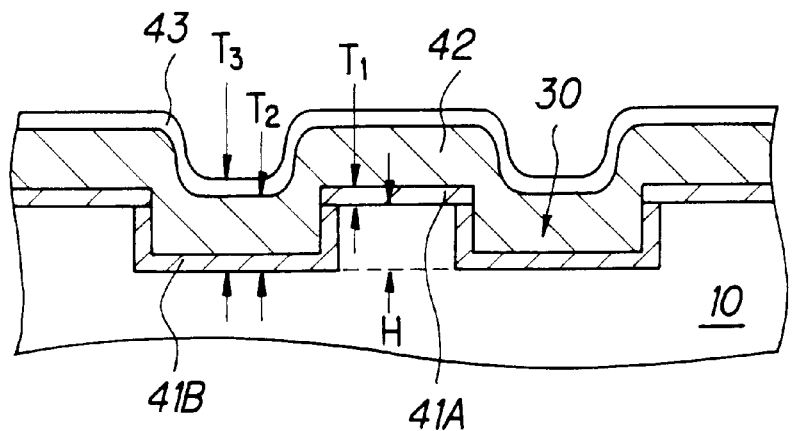
FIGS. 13A, 13B and 13C are schematic partial cross-sectional views showing a body and so on for illustrating further each step of the layer planarizing method for the semiconductor device according to the seventh embodiment.

Thereafter, in the same method as [Step-630] of the sixth embodiment, a third layer 43 having a thickness of 0.10 $\mu$m and a lower polishing rate than that of the second layer 42 is formed on the surface of the second layer 42 (see FIG. 13A). Namely, a height $T_3$ is 0.42 $\mu$m. The thickness of the third layer 43 meets a relationship, $|T_3-(H+T_1)| \leq 0.1$ $\mu$m.

[Step-740]

Figure 13B:
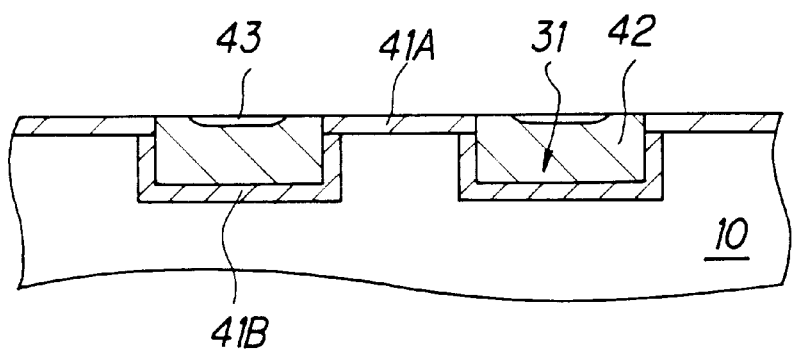
Figure 13C:
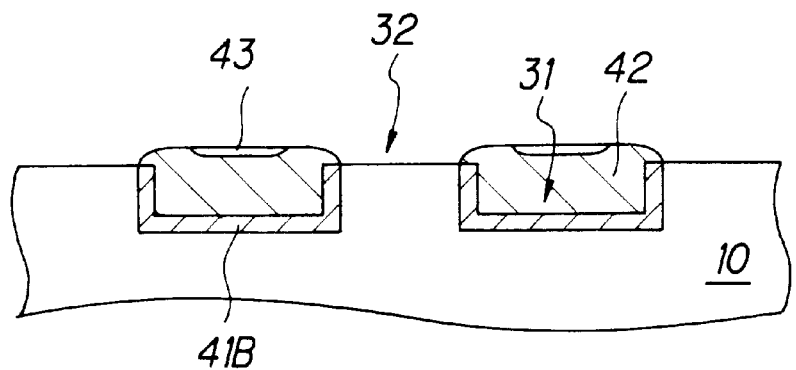

Subsequently, in the same method as [Step-640] of the sixth embodiment, the third layer 43 and the second layer 42 are polished, so that the first layer 41A formed on the top portion of the recess portion 30 which is the stepped portion (surface of the body 10) is exposed (see FIG. 13B).

[Step-750]

Next, in the same manner as [Step-430] of the fourth embodiment, the first layer 41A left on the surface of the body 10 is removed. Namely, the silicon nitride ($Si_3N_4$) constituting the first layer 41A is removed by phosphorous arid kept at a temperature of 140° C. Also, the silicon oxide ($SiO_2$) forming the first layer 41A is removed by using diluted fluorine acid of 0.5%. Thus, as shown in schematically shown in FIG. 13C, the second layer 42 made of BPSG is filled in the recess portion 30, and the isolation region 31 having the trench structure where the surface is substantially flat is formed. On the other hand, for example, a region 32 where the semiconductor element is to be formed (semiconductor element forming region) is formed between the isolation regions 31. Incidentally, it is possible to remove the first layer 41A, left on the surface of the body 10, by the polishing method.

Thus, the isolation region 31 having the trench structure formed in accordance with the seventh embodiment is composed of the recess portion 30 formed in the body 10, the first layer formed on the bottom surface and the side walls of the recess portion 30 and the second layer 42 filling the recess portion 30.

Eighth Embodiment

An eighth embodiment is a modification of the seventh embodiment and is different from the seventh embodiment in formation of the second layer 42 made of polycrystalline silicon (poly-silicon), formation of the third layer, and step corresponding to [Step-750] of the seventh embodiment. The planarizing method according to the eighth embodiment will now be described with reference to FIGS. 14A to 14C which schematically shows the body and the like in partial cross section.

[Step-800]

First of all, in the same manner as [Step-700] in the fourth embodiment, a first layer part 41A is formed on the surface of the body 10. Subsequently, the recess portion 30 is oxidized by, for example, a thermal oxidizing method so that the oxide layer ($SiO_2$) is formed on the bottom surface and the side walls of the recess portion 30. A height (depth) H of the recess portion which is the stepped portion formed in the body 10 is 0.25 $\mu$m. Also, $T_1$ is 0.16 $\mu$m. Accordingly, the value of ($H+T_1$) is 0.41 $\mu$m.

[Step-810]

Next, in the same way as [Step-720] of the seventh embodiment, a second layer 42 having a higher polishing rate than that of the first layer 41A is formed to cover each stepped portion so that the a height $T_2$ from the bottom surface of the stepped portion (i.e., surface of the recess portion 30) to the surface of the second layer 42 is somewhat lower than or substantially equal to ($H+T_1$). The second layer 42 is made of polycrystalline silicon unlike the seventh embodiment. The second layer 42 is deposited by the CVD method using $SiH_4$ gas and a heating temperature of 610° C. A thickness of the second layer 42 at the bottom portion of the stepped portion (i.e., bottom portion of the recess portion 30) is set at 0.40 $\mu$m. Namely, the height $T_2$ of the surface of the second layer 42 from the bottom surface of the stepped portion is 0.42 $\mu$m. Accordingly, a value of $T_2$ (=0.32 $\mu$m) is substantially equal to a value of ($H+T_1$).

[Step-820]

Next, the surface of the second layer 42 made of polycrystalline silicon is oxidized to form a third layer 43 made of $SiO_2$ and having a thickness of 40 nm. The third layer 43 may be formed by a byrogenic method under, for example, the following conditions. Incidentally, the thickness of the third layer 43 meets a relationship, $|T_3-(H+T_1)| \leq 0.1$ $\mu$m.

Oxidizing atmosphere: $O_2/H_2=4/1$

Oxidizing temperature: 950° C.

[Step-830]

Subsequently, in the same method as [step-640] of the sixth embodiment, the third layer 43 and the second layer 42 are polished, so that the first layer 41A formed on the top portion of the recess portion 30 which is the stepped portion (surface of the body 10) is exposed (see FIG. 14A). Incidentally, the polishing rate of the second layer 42 made of polycrystalline silicon is about twenty times higher than the polishing rate of the third layer 43.

[Step-840]

Figure 14A:
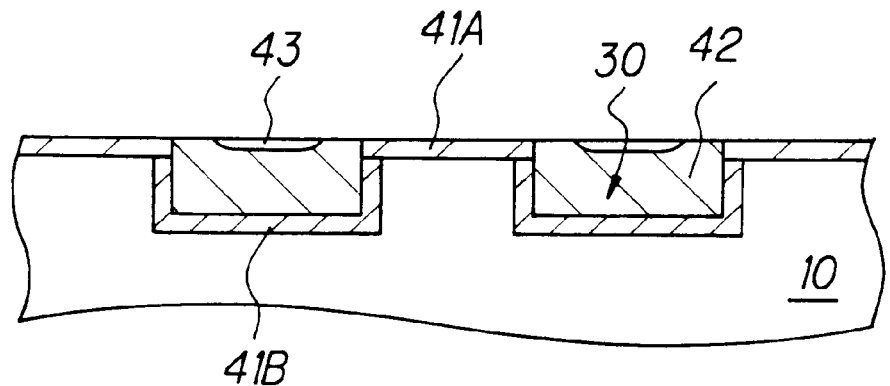
FIGS. 14A, 14B and 14C are schematic partial cross-sectional views showing a body and so on for illustrating each step of a layer planarizing method for a semiconductor device according to an eighth embodiment.
Figure 14B:
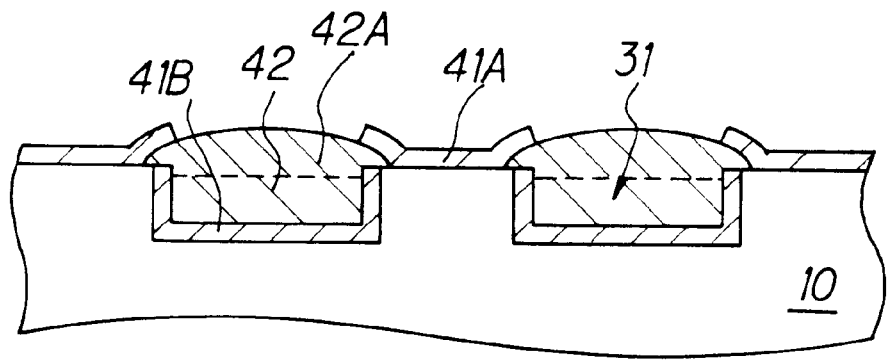

Under this condition, as shown in FIG. 14A, a part of the second layer 42 made of polycrystalline silicon is exposed. Therefore, the surface of the second layer made of polycrystalline silicon 42 is oxidized to form an oxide layer 42A ($SiO_2$) on the surface of the second layer 42 (see FIG. 14B). A thickness of the oxide layer 42A is about 0.1 $\mu$m. The oxide layer 42A may be formed by a byrogenic method under the following conditions.

Oxidizing atmosphere: $O_2/H_2=4/1$

Oxidizing temperature: 950° C.

[Step-850]

Figure 14C:
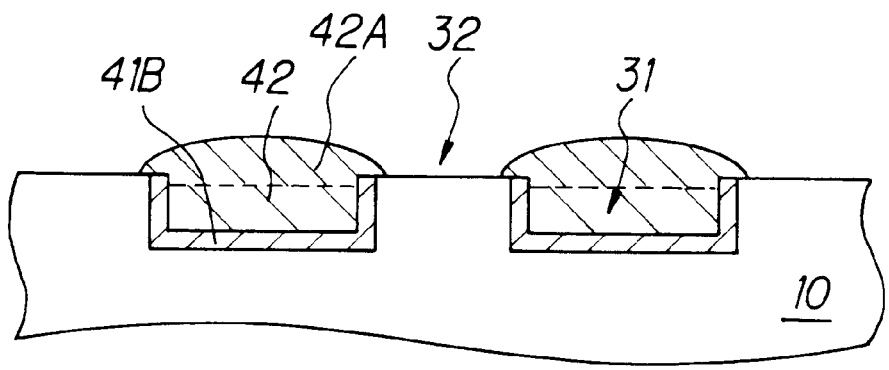

Next, in the same manner as [Step-750] of the seventh embodiment, the first layer 41A left on the surface of the body 10 is removed (see FIG. 14C). Thus, the isolation region 31 having the trench structure formed is formed. On the other hand, for example, a region 32 where the semiconductor element is to be formed is formed between the isolation regions 31.

Thus, the isolation region 31 having the trench structure formed in accordance with the eighth embodiment is composed of the recess portion 30 formed in the body 10, the first layer 41B formed on the bottom surface and the side walls of the recess portion 30, the second layer 42 filling the recess portion 30, and the oxide layer 42A formed on the surface portion of the second layer 42.

Ninth Embodiment

A ninth embodiment is also a modification of the seventh embodiment and relates to a first preferred application of the planarizing method in accordance with the second aspect of the invention. The ninth embodiment is different from the seventh embodiment in formation of the first layer 41. Namely, in the ninth embodiment, the process for forming the first layer having a thickness $T_1$ of the top portion of the stepped portion at least on the top portion of the stepped portion having a height H and formed on the body includes the step of forming the first layer 41 on the surface of the body 10 including the bottom of the recess portion 30 constituting the stepped portion after forming the stepped portion constituted by the recess portion 30 in the body 10. The planarizing method according to the ninth embodiment will now be described with reference to FIGS. 15A to 15C and FIGS. 16A and 16B which schematically shows the body and the like in partial cross section. Also, the first layer is used as polishing stoppers not only to improve the uniformity of the polishing effect but also to have a practical function to prevent impurities from being diffused into the body from the second layer made of, for example, BPSG.

[Step-900]

First of all, in the same method as [Step-200] of the second embodiment, each recess portion 30 is formed on the body 10 which is composed of a semiconductor body. The recess portion 30 may be formed by a well known photolithographic technic and a well known etching technique.

The recess portion 30 corresponds to the stepped portion. In more detail, the top portion of the stepped portion corresponds to the surface of the body 10, the bottom portion of the stepped portion corresponds to the bottom portion of the recess portion, and the bottom surface of the stepped portion corresponds to the bottom surface of the recess portion 30. A depth of the recess portion 30 that is a height of the stepped portion is 0.30 μm. Thereafter, the entire body 10 including the recess portions 30 is oxidized. As a result, the first layer 41 made of $SiO_2$ is formed (see FIG. 15A). A thickness $T_1$ of the first layer 41 is 20 nm.

[Step-910]

Figure 15A:
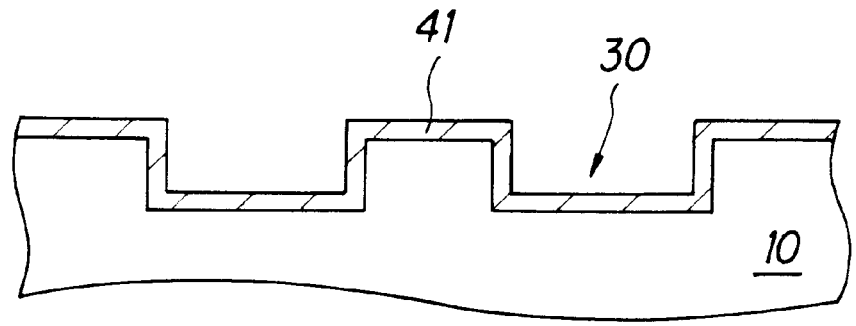
FIGS. 15A, 15B and 15C are schematic partial cross-sectional views showing a body and so on for illustrating each step of a layer planarizing method for a semiconductor device according to a ninth embodiment.
Figure 15B:
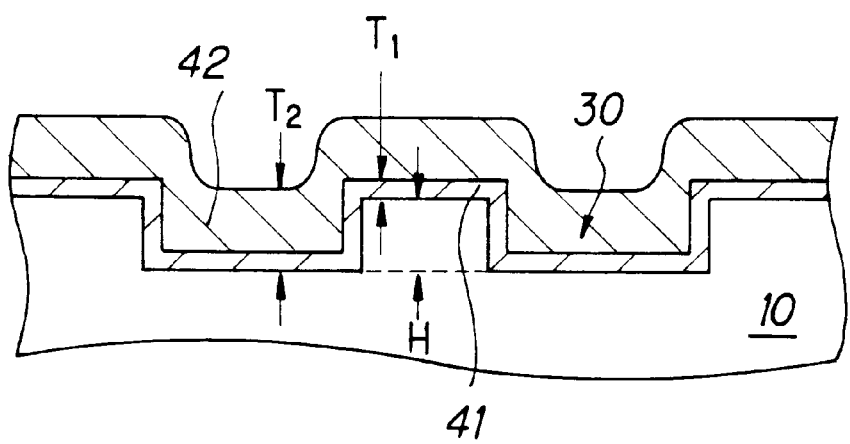

Next, a second layer 42 having a higher polishing rate than that of the first layer 41 is formed to cover each stepped portion so that the a height $T_2$ from the bottom surface of the stepped portion (i.e., surface of the recess portion 30) to the surface of the second layer 42 is somewhat lower than or substantially equal to $(H+T_1)$(see FIG. 15B). This step may be carried out in the same way as [Step-720] of the seventh embodiment or [Step-810] of the eighth embodiment. A thickness of the second layer 42 in the bottom portion of the stepped portion (i.e., the bottom portion of the recess portion 30) is 0.30 μm. Namely, a height $T_2$ from the bottom surface of the stepped portion to the surface of the second layer 42 is 0.32 μm (=0.02 μm+0.30 μm). Accordingly, a value of $T_2$ (=0.32 μm) is equal to a value of $(H+T_1)$(0.32 μm=0.02 μm+0.30 μm). In the case where the second layer 42 is made of BPSG, after the formation of the second layer 42, it is preferable to reflow the second layer 42 at a temperature of 900° C. for 20 minutes in a nitrogen gas atmosphere.

[Step 920]

Figure 15C:
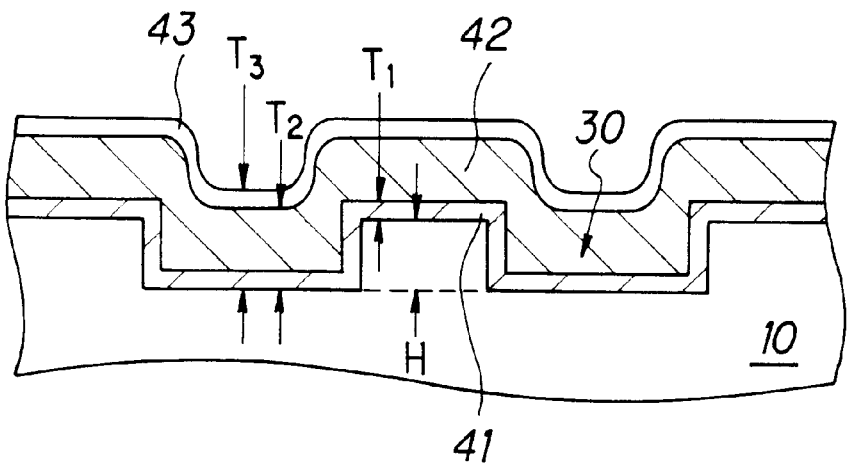

Thereafter, in the same method as [Step-730] of the seventh embodiment, a third layer 43 made of silicon oxide and having a polishing rate lower than that of the second layer is formed on the second layer 42 (see FIG. 15C). A thickness $T_3$ is about 0.42 μm in the case of the seventh embodiment or about 0.32 μm in the case of the eighth embodiment.

[Step 930]

Figure 16A:
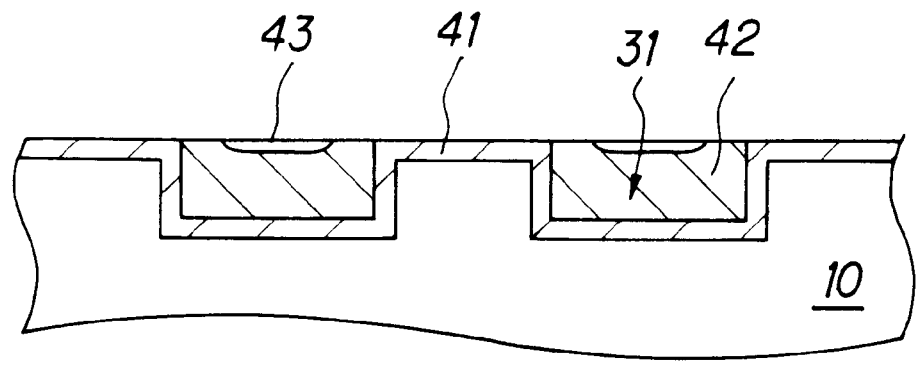
FIGS. 16A and 16B are schematic partial cross-sectional views showing a body and so on for illustrating further each step of the layer planarizing method for the semiconductor device according to the ninth embodiment.

Subsequently, in the same method as [Step-640] of the sixth embodiment, the third layer 43 and the second layer 42 are polished, so that the first layer 41 formed on the top portion of the recess portion 30 which is the stepped portion (surface of the body 10) is exposed (see FIG. 16A).

[Step 940]

Figure 16B:
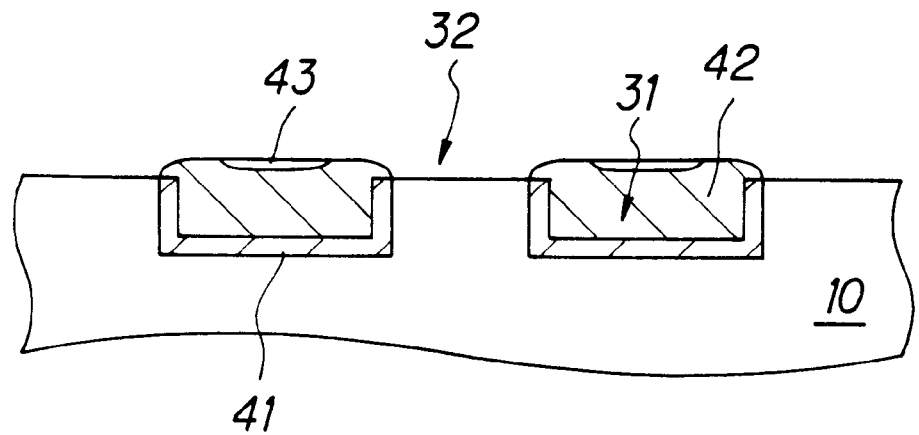

Thereafter, in the case where the second layer 42 is made of polycrystalline silicon, after the same treatment as [Step 840] of the eighth embodiment has been effected on the second layer 42, in the same way as [Step 750] of the seventh embodiment, the first layer 41 left on the surface of the body 10 is removed (see FIG. 16B). Thus, each isolation region 31 having the trench structure formed is formed. On the other hand, for example, a region 32 where the semiconductor element is to be formed is formed between the isolation regions 31.

Tenth Embodiment

A tenth embodiment is also a modification of the seventh embodiment and relates to a second preferred application of the planarizing method in accordance with the second aspect of the invention. The tenth embodiment is different from the seventh embodiment in formation of the first layer 41. Namely, in the tenth embodiment, the process for forming the first layer having a thickness $T_1$ of the top portion of the stepped portion at least on the top portion of the stepped portion having a height H and formed on the body includes the step of forming the stepped portion constituted by the recess portion 30 in the body 10 after forming the first layer 41 on the surface of the body 10. The planarizing method according to the tenth embodiment will now be described with reference to FIGS. 17A to 17C and FIGS. 18A and 18B which schematically shows the body and the like in partial cross section.

[Step 1000]

First of all, in the same method as in the third embodiment, the first layer 41 is formed only on the surface of the body 10. Namely, the first layer 41 is made of silicon oxide ($SiO_2$) or silicon nitride ($Si_3N_4$) or otherwise composed of a two-layer film made of silicon oxide ($SiO_2$) or silicon nitride ($Si_3N_4$) deposited by, for example, the CVD method. Subsequently, the first layer 41 and the body 10 are selectively etched to form stepped portions constituted by recess portions 30 in the body 10 by using a photolithographic technique and an etching technique (see FIG. 17A). The first layer 41 is formed only on the surface of the body 10. Namely, the first layer 41 is formed only on the top portions of the stepped portion provided on the body 10. A depth of the recess portion 30 that is a height of the stepped portion is 0.30 μm. On the other hand, a thickness $T_1$ of the first layer 41 on the top portion of the stepped portion (i.e., surface of the body 10) is 20 nm.

[Step-1010]

Figure 17A:
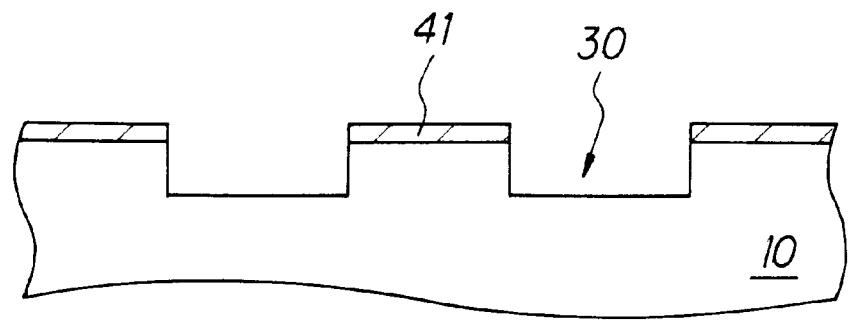
FIGS. 17A, 17B and 17C are schematic partial cross-sectional views showing a body and so on for illustrating each step of a layer planarizing method for a semiconductor device according to a tenth embodiment.
Figure 17B:
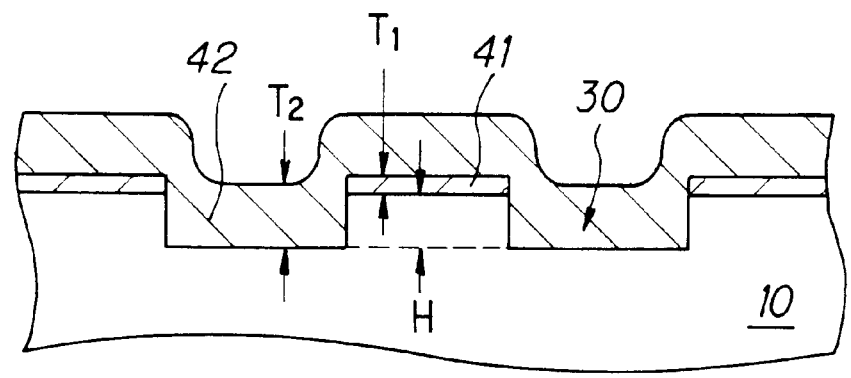

Next, a second layer 42 having a higher polishing rate than that of the first layer 41 is formed to cover each stepped portion so that the a height $T_2$ from the bottom surface of the stepped portion (i.e., surface of the recess portion 30) to the surface of the second layer 42 is somewhat lower than or substantially equal to $(H+T_1)$(see FIG. 17B). This step may be carried out in the same way as [Step-720] of the seventh embodiment or [Step-810] of the eighth embodiment A thickness of the second layer 42 in the bottom portion of the stepped portion (i.e., the bottom portion of the recess portion 30) is 0.30 μm. Namely, a height $T_2$ from the bottom surface of the stepped portion to the surface of the second layer 42 is 0.25 μm (=0.02 μm+0.30 μm). Accordingly, a value of $T_2$(=0.27 μm) is equal to a value of $(H+T_1)$(0.32 μm=0.30 μm+0.02 μm). In the case where the second layer 42 is made of BPSG, after the formation of the second layer 42, it is preferable to reflow the second layer 42 at a temperature of 900° C. for 20 minutes in a nitrogen gas atmosphere.

[Step 1020]

Figure 17C:
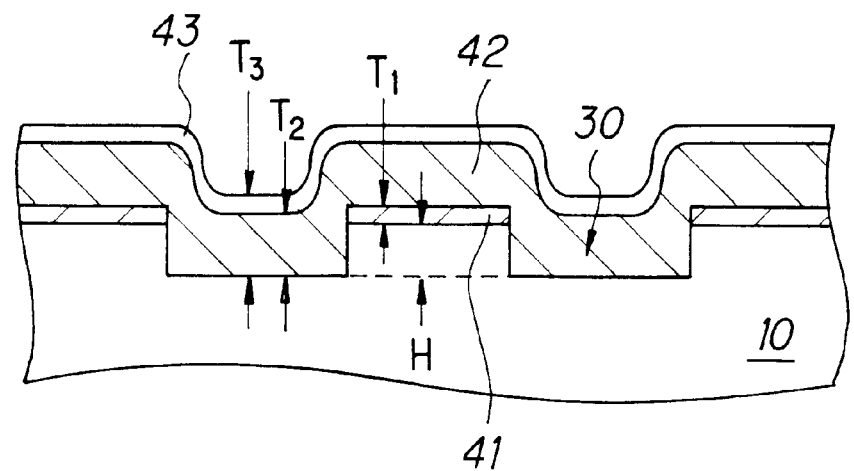

Thereafter, in the same method as [Step-730] of the seventh embodiment or [Step-820] of the eighth embodiment, a third layer 43 made of silicon oxide and having a polishing rate lower than that of the second layer is formed on the second layer 42 (see FIG. 17C).

[Step 1030]

Figure 18A:
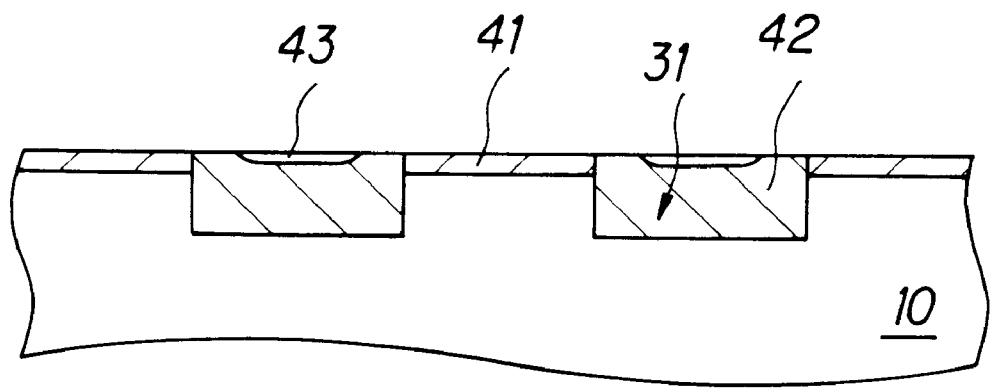
FIGS. 18A and 18B are schematic partial cross-sectional views showing a body and so on for illustrating further each step of the layer planarizing method for the semiconductor device according to the tenth embodiment.

Subsequently, in the same method as [Step-640] of the sixth embodiment, the third layer 43 and the second layer 42 are polished, so that the first layer 41 formed on the top portion of the recess portion 30 which is the stepped portion (surface of the body 10) is exposed (see FIG. 18A).

[Step 1040]

Figure 18B:
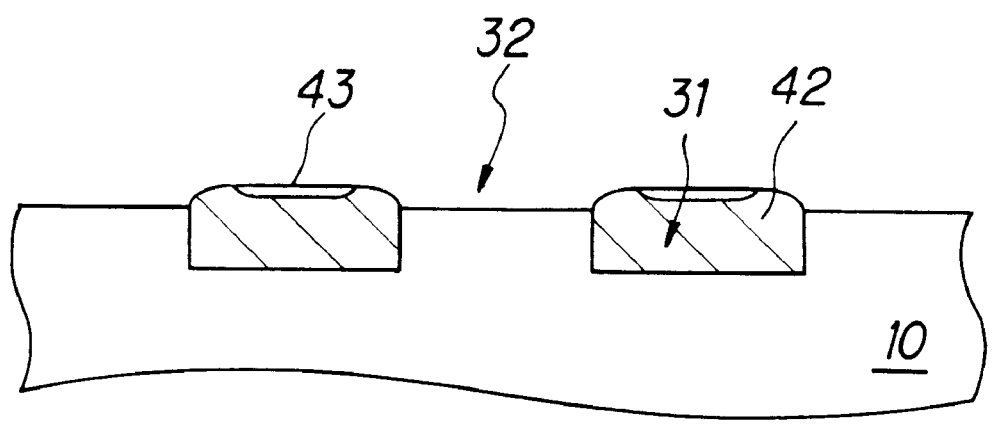

Thereafter, in the case where the second layer 42 is made of polycrystalline silicon, after the same treatment as [Step 840] of the eighth embodiment has been effected on the second layer 42, in the same way as [Step 750] of the seventh embodiment, the first layer 41 left on the surface of the body 10 is removed (see FIG. 18B). Thus, each isolation region 31 having the trench structure formed is formed. On the other hand, for example, a region 32 where the semiconductor element is to be formed is formed between the isolation regions 31.

Incidentally, in the case where the second layer 42 is made of, for example, BPSG, impurities are diffused from the second layer 42 to the body so that a problem would be raised. In such a case, it is sufficient that the second layer 42 is made of a two-layer structure of polycrystalline silicon and BPSG.

Eleventh Embodiment

Figure 19A:
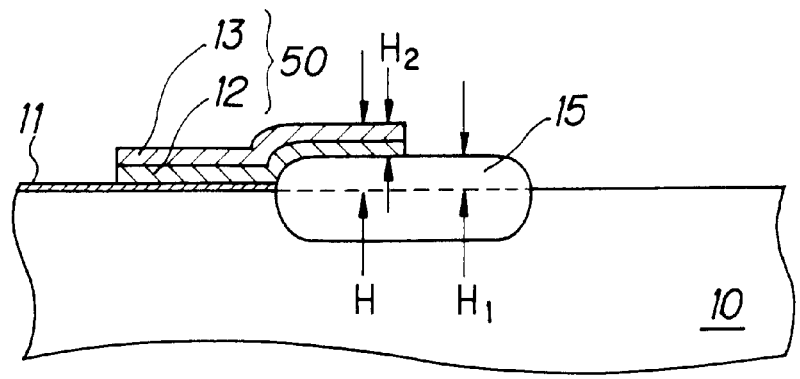
FIGS. 19A, 19B and 19C are schematic partial cross-sectional views showing a body and so on for illustrating each step of a layer planarizing method for a semiconductor device according to an eleventh embodiment.

An eleventh embodiment relates to a planarizing method in accordance with a third aspect of the invention. In the eleventh embodiment, it is intended to planarize the insulating layer formed between the interconnection layers and to planarize a so-called interlayer insulating layer. In the eleventh embodiment, a base is composed of a semiconductor body. Also, the stepped portion is composed of an interconnection layer 50 formed on an isolation region 15 having a LOCOS structure formed on the body (see FIG. 19A). Namely, the stepped portion is represented by "double" (i.e., n=2). The first stepped portion is composed of the isolation region 15 having a LOCOS structure, and the second stepped portion is composed of the interconnection layer 50. In the eleventh embodiment, the layer structure above the bottom portion of the stepped portion is represented by four layers (k=2, the second, k-th film being a fourth layer).

The (2m-1)-th film (where m=1, 2, ... k, and k=n=2 in case of the eleventh embodiment) is made of silicon oxide ($SiO_2$), whereas the 2m-th film is made of silicon oxide containing impurities (i.e., BPSG). The first layer is applied not only to the top portion of each stepped portion but also to a bottom surface and side walls of the stepped portion. Each film from the 2m-th film to the second film is polished by a chemical mechanical polishing method (CMP). Also, the first layer is used as polishing stoppers not only to improve the uniformity of the polishing effect but also to have a practical function to prevent impurities from being diffused into the body from the second layer made of, for example, BPSG.

In the eleventh embodiment, assuming that H be a height from the lowermost surface of an n-number of the stepped portions to the uppermost surface thereof, $T_1$ be a thickness of the first film in the uppermost portion of the n-number of the stepped portion, and $T_{2k}$ be a height from the lowermost surface of the n-number of the stepped portions to the top surface of the 2k-th film (however, $2 \leq k$), a value of $T_{2k}$ is set to be greater than $(H+T_1)$.

Furthermore, in the eleventh embodiment, a relationship, k=n=2, is established. When $T_1$ is the thickness of the first film in the uppermost portion of the n-number of stepped portion, and $H_i$ is the height of the i-th stepped portion from the lowermost portion of the n-number of stepped portion (where i=1, 2, ..., n), a height $T_{2j+1}$ from the lowermost surface of the n-number of stepped portion to the top surface of the (2j+1)-th film (where j=1, 2, ..., k-1, but $2 \leq k$) is approximately given as follows:

$$T_1 + \sum_{i=n-j+1}^{n} H_i$$

The layer planarizing method in accordance with the eleventh embodiment will now be described with reference to FIGS. 19A to 19D and FIGS. 20A to 20C which schematically show the body and the like in partial cross section.
[Step 1100]

First of all, in the same method as [Step 100] of the first embodiment, an interconnection 50 is formed on an isolation region 15 having a LOCOS structure. The interconnection on the isolation region 15 is composed of, for example, a polycrystalline silicon layer 12 which is doped with phosphorous with a thickness of 0.10 µm and a tungsten silicide ($WSi_2$) layer 13 having a thickness of 0.10 µm. A height H (=$H_1+H_2$) from the lowermost surface of the n-number of stepped portions to the uppermost portion thereof is 0.35 µm. Namely, the height $H_1$ of the isolation region 15 (i.e., the first stepped portion) is 0.15 µm, and the height $H_2$ of the interconnection 50 (i.e., the second stepped portion) is 0.20 µm.
[Step 1110]

Figure 19B:
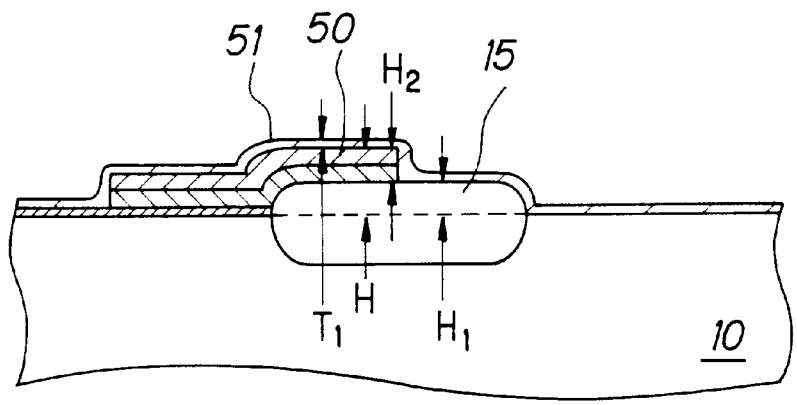

In the same manner as [Step 610] of the sixth embodiment, the n-number of stepped portions ($n \geq 2$, note that n=2 is established in the eleventh embodiment) formed on the body 10 are covered by a first film 51 (see FIG. 19B). The first film 51 is set at 0.10 µm in thickness. Namely, a thickness $T_1$ of the first film of the uppermost portion of the n-number of stepped portions is 0.10 µm.
[Step 1120]

Next, a second layer 52 having a higher polishing rate than that of the first layer 51 is formed to cover each stepped portion with the second layer 52. In the eleventh embodiment, the second layer 52 is formed of a BPSG layer deposited by, for example, a low-pressure CVD method. This treatment may be carried out in the same way as [Step 620] of the sixth embodiment. A thickness of the second layer 52 is set at 0.17 µm. Namely, the height $T_2$ is given as follows:

$$T_2 = 0.10\,\mu\mathrm{m} + 0.17\,\mu\mathrm{m}$$
$$= 0.27\,\mu\mathrm{m}$$

[Step 1130]

Figure 19C:
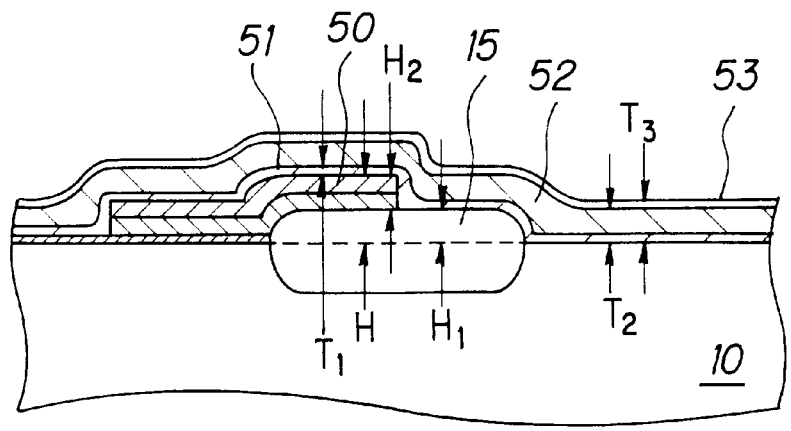

Thereafter, a third layer 53 (which is the (2m+1)-th film, m=1) having a lower polishing rate than that of the second layer 52 is formed on the surface of the second layer 52 (see FIG. 19C). The third layer 53 may be formed into a silicon oxide layer by a plasma CVD method using, for example, tetraethoxysilane (TEOS). Incidentally, the third layer 53 may be made of silicon nitride ($Si_3N_4$). A thickness of the third layer 53 is set at 30 nm. Accordingly, the height $T_3$ from the lowermost surface of the n-number of stepped portions to the surface of the (2m+1=3)-th film 53 is given as follows:

$$T_3 = 0.10\,\mu\mathrm{m} + 0.17\,\mu\mathrm{m} + 0.03\,\mu\mathrm{m}$$
$$= 0.30\,\mu\mathrm{m}$$

On the other hand, since n=2 and j=1, the value of:

$$T_1 + \sum_{i=n-j+1}^{n} H_i$$

is 0.30 µm which is the same as $T_3$.

Incidentally, in the layer planarizing method according to the third aspect of the invention, [Step 1120] and [Step 1130] are repeated by (k-1) times, and in the eleventh embodiment, since k=2 is established, [Step 1120] and [Step 1130] are once executed.
[Step 1140]

Figure 20A:
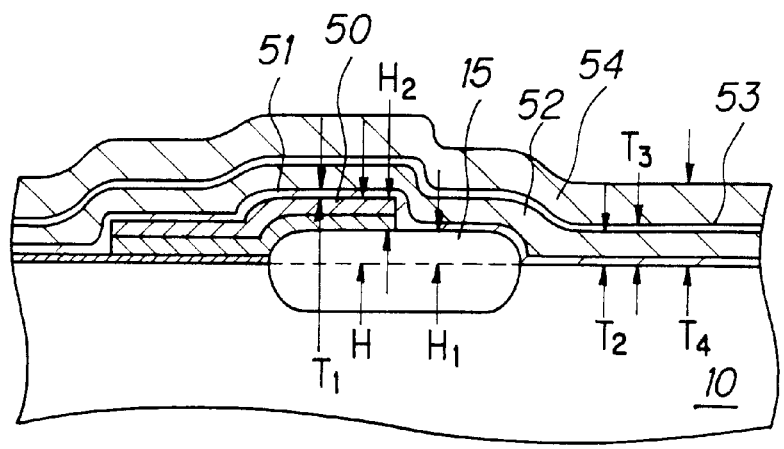
FIGS. 20A, 20B and 20C are schematic partial cross-sectional views showing a body and so on for illustrating further each step of the layer planarizing method for the semiconductor device according to the eleventh embodiment.

Thereafter, a 2k-th (fourth) layer 54 having a higher polishing rate than that of a (2k-1)-th (third) layer 53 is formed on the (2k-1)-th layer 53 (see FIG. 20A). This step may be carried out in the same way as [Step 1120]. A thickness of the fourth layer 54 is 0.50 μm. The value of (H+T$_1$) is given as follows:

$$(H + T_1) = 0.35 \mu m + 0.10 \mu m$$

$$= 0.45 \mu m$$

Also, a height T$_{2k}$ from the lowermost surface of the n-number (double) of stepped portions to the surface of the (2k=4)-th layer 54 is given as follows.

$$T_4 = 0.10 \mu m + 0.17 \mu m + 0.03 \mu m + 0.50 \mu m$$

$$= 0.80 \mu m$$

Therefore, the value of T$_{2k}$ is greater than the value of (H+T$_1$).

[Step-1150]

Figure 20B:
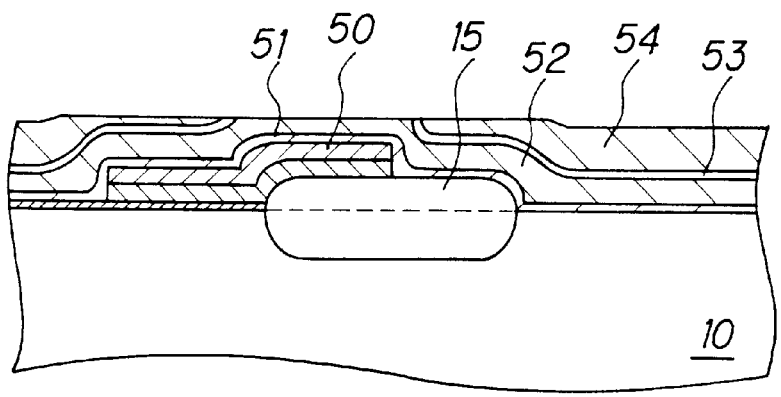
Figure 20C:
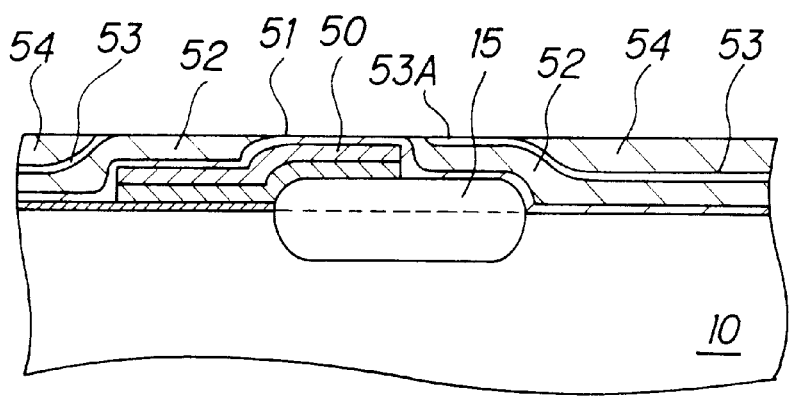

Thereafter, the polishing treatment is effected from the (2k=4)-th layer 54 to the second layer 52 to expose the first layer formed on the outermost position of the n-times overlapped stepped portions. This step may be carried out in the same way as [Step 640] of the sixth embodiment. FIG. 20B is a schematic partial cross-sectional view showing the body and the like under the polishing treatment. Also, FIG. 20C is a schematic partial cross-sectional view showing the body and the like upon completion of the polishing treatment.

A height H$_1$ of the first stepped portion is 0.15 μm. On the other hand, a height of the third layer 53 formed above the first stepped portion with reference to the surface of the body 10 which is the lowermost surface of the stepped portion is given as follows:

$$H_1 + T_3 = 0.15 \mu m + 0.30 \mu m$$

$$= 0.45 \mu m$$

Accordingly, with reference to the surface of the body 10 which is the lowermost surface of the stepped portion, the height of the third layer 53 formed above the first stepped portion is equal to the height of the surface of the first layer on the top portion of the n-number of the stepped portions.

Therefore, when the polishing treatment is affected from the 2k-th layer (the fourth layer 54 in the eleventh embodiment) to the second layer 52 to expose the first layer 51 formed on the top portion of the n-number of stepped portions, not only does the first layer 51 formed on the top portion of the n-number of stepped portions serve as a stopper but also the (2m+1)-th layer formed above the first stepped portion (i.e., the third layer 53A according to the eleventh embodiment in FIG. 20C) serves as a stopper. Accordingly, it is possible to effectively suppress the excessive polishing of the k-th layer (i.e., fourth layer 54) or the 2m-th layer (i.e., second layer 52).

Incidentally, the 2m-th layer (where m=1, 2, . . . ,k, 2≦k) may be made of polycrystalline silicon or a laminate of silicon oxide containing impurities and polycrystalline silicon. Also, the (2m−1)-th layer may be made of silicon nitride or a laminate of silicon oxide and silicon nitride.

Thus, an insulating multi-layer formed between the n-times overlapped stepped portions and whose surface is planarized by the lamination of the 2k insulating layers is produced by the layer planarizing method in accordance with the eleventh embodiment. The first layer of the insulating multi-layer covers the top portion of the n-times overlapped stepped portions. On the other hand, a part of the surface of the insulating multi-layer above the bottom portion of the stepped portions is composed of the 2k-th layer. The 2m'-th layer (where m'=1, 2, . . . , k−1, 2≦k) and the (2m'+1)-th layer are exposed between the first layer of the insulating layer which covers the top portion of the n-times overlapped stepped portions and the 2k-th layer thereof. The 2m'-th layer has a higher polishing rate than that of the (2m'+1)-th layer. Furthermore, the 2k-th layer has a higher polishing rate than that of the (2k−1)-th layer.

Twelfth Embodiment

A twelfth embodiment is a modification of the eleventh embodiment and relates to a preferred embodiment of the layer planarizing method in accordance with the third aspect of the invention. The twelfth embodiment is different from the eleventh embodiment in that a (2k+1)-th layer (i.e., fifth layer 55 in the twelfth embodiment) which has a lower polishing rate than that of a 2k-th layer (i.e., fourth layer 54 in the twelfth embodiment) is formed on the 2k-th layer between [Step 1140] and [Step 1150] of the eleventh embodiment, in that in [Step 1150] of the eleventh embodiment, the (2k+1)-th layer (i.e., fifth layer 55 in the twelfth embodiment) to the second layer are polished, and a layer thickness of the 2k-th layer (i.e., fourth layer 54 in the twelfth embodiment) is varied from that of the eleventh embodiment. In the twelfth embodiment, five layers (2k+1=2×2+1) are laid above the bottom portion of the stepped portions. The fifth layer 55 is made of silicon oxide (SiO$_2$).

Incidentally, also in the twelfth embodiment, assuming that k is equal to n, i.e., 2, T$_1$ is the thickness of the first layer on the top portion of the n-times overlapped stepped portions, and H$_i$ is the height of the i-th stepped portion (where i=1, 2, . . . , n) from the lowermost portion of the n-times overlapped stepped portions, a height T$_{2j+1}$ from the bottom surface of the n-times overlapped stepped portions to the surface of the (2j+1)-th layer (where j=1, 2, . . . , k−1, 2≦k) is approximately the same as the value given as follows:

$$T_1 + \sum_{i=n-j+1}^{n} H_i$$

The layer planarizing method according to the twelfth embodiment will now be described with reference to FIGS. 21A to 21C which are schematic, partial cross-sectional views of the body and the like.

[Step 1200]

First of all, in the same way as [Step 1100], an interconnection 50 is formed on an isolation region 15 having a LOCOS structure. A height H$_1$ of the isolation region 15 which forms the first stepped portion is 0.15 μm, and a height H$_2$ of the interconnection layer 50 which forms the second stepped portion is 0.20 μm. A height H (=H$_1$+H$_2$) from the lowermost surface of the n-times overlapped stepped portions to the uppermost portion thereof is 0.35 μm.

[Step 1210]

In the same manner as [Step 1110] of the eleventh embodiment, the n-number of stepped portions (n≧2, note that n=2 is established in the twelfth embodiment) formed on the body 10 are covered by a first layer 51 which is made of silicon oxide (SiO$_2$). The first layer 51 is set at 0.10 μm in thickness. Namely, a thickness T$_1$ of the first layer of the uppermost portion of the n-number of stepped portions is 0.10 μm.

[Step 1220]

Next, in the same manner as [Step 1120] of the eleventh embodiment, a second layer 52 having a higher polishing rate than that of the first layer 51 is formed to cover each stepped portion with the second layer 52. A thickness of the second layer 52 is set at 0.17 µm. Namely, the height $T_2$ is given as follows:

$$T_2 = 0.10\,\mu m + 0.17\,\mu m$$
$$= 0.27\,\mu m$$

[Step 1230]

Thereafter, in the same manner as [Step 1130] of the eleventh embodiment, a third layer 53 (which is the (2m+1)-th film, m=1) having a lower polishing rate than that of the second layer 52 is formed on the surface of the second layer 52. A thickness of the third layer 53 is set at 30 nm. Accordingly, the height $T_3$ from the lowermost surface of the n-number of stepped portions to the surface of the (2m+1=3)-th layer 53 is given as follows:

$$T_3 = 0.10\,\mu m + 0.17\,\mu m + 0.03\,\mu m$$
$$= 0.30\,\mu m$$

On the other hand, since n=2 and j=1, the value of:

$$T_1 + \sum_{i=n-j+1}^{n} H_i$$

is 0.30 µm which is the same as $T_3$.

Incidentally, k is set at 2 also in the twelfth embodiment. Accordingly, in the twelfth embodiment, the fact that [Step 1120] and [Step 1130] are repeated by (k−1) times means that [Step 1120] and [Step 1130] are once executed.

[Step 1240]

Figure 21A:
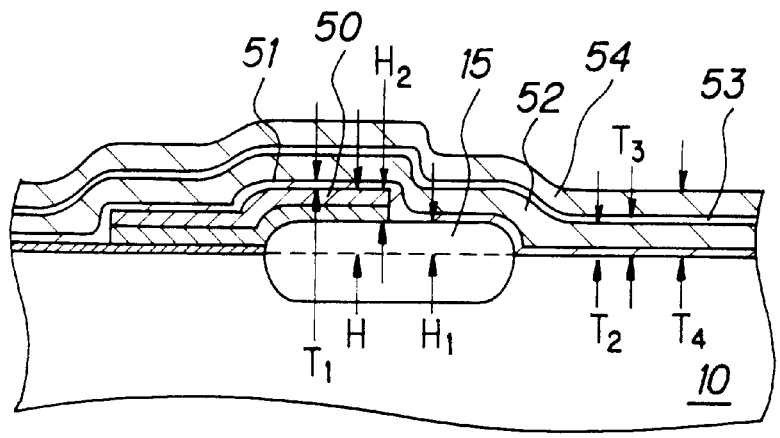
FIGS. 21A, 21B and 21C are schematic partial cross-sectional views showing a body and so on for illustrating each step of a layer planarizing method for a semiconductor device according to a twelfth embodiment.
Figure 21B:
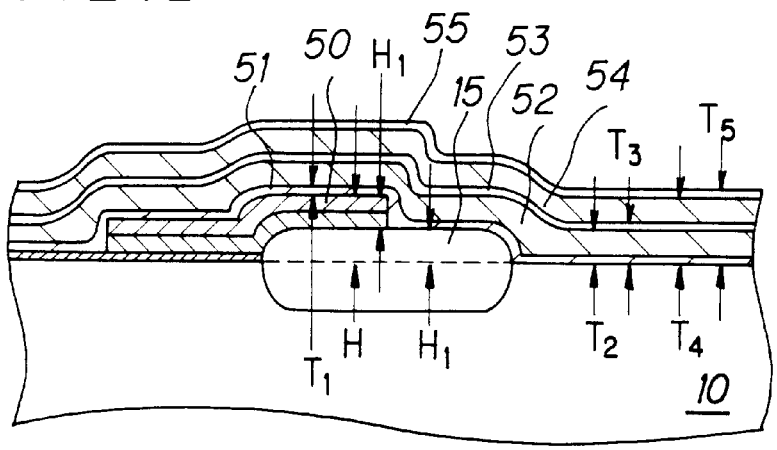
Figure 21C:
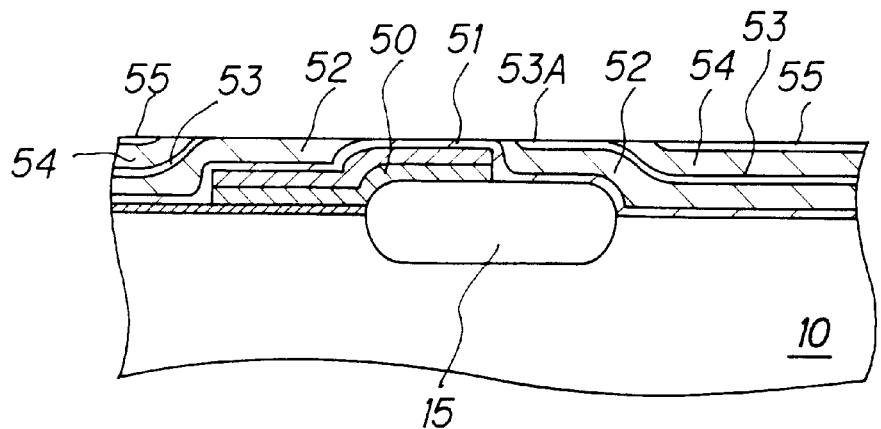

Thereafter, a 2k-th (fourth) layer 54 having a higher polishing rate than that of a (2k−1)-th (third) layer 53 is formed on the (2k−1)-th layer 53 (see FIG. 21A). This step may be carried out basically in the same way as [Step 1220]. A thickness of the fourth layer 54 is 0.12 µm. The value of (H+$T_1$) is given as follows:

$$(H + T_1) = 0.35\,\mu m + 0.10\,\mu m$$
$$= 0.45\,\mu m$$

Also, a height $T_{2k}$ from the lowermost surface of the n-number (double) of stepped portions to the surface of the (2k=4)-th layer 54 is given as follows.

$$T_4 = 0.10\,\mu m + 0.17\,\mu m + 0.03\,\mu m + 0.12\,\mu m$$
$$= 0.42\,\mu m$$

Therefore, the value of $T_{2k}$ is smaller than the value of (H+$T_1$).

[Step 1250]

Subsequently, a (2k+1)-th layer, i.e., fifth layer 55 which has a lower polishing rate than that of a 2k-th layer, i.e., fourth layer 54 is formed on the 2k-th layer 54 (see FIG. 21B). The fifth layer 55 may be formed into a silicon oxide layer by a plasma CVD method using, for example, tetraethoxysilane (TEOS). Incidentally, the fifth layer 55 may be made of silicon nitride ($Si_3N_4$). A thickness of the fifth layer 55 is set at 30 nm. Accordingly, the height $T_5$ from the lowermost surface of the n-number of stepped portions to the surface of the (2k+1=5)-th layer 55 is given as follows:

$$T_5 = 0.10\,\mu m + 0.17\,\mu m + 0.03\,\mu m + 0.12\,\mu m + 0.03\,\mu m$$
$$= 0.45\,\mu m$$

Assuming that H be the height from the lowermost surface of the n-times overlapped stepped portions to the top portion thereof and $T_{2k+1}$ be the height from the lowermost surface of the n-times overlapped stepped portions to the surface of the (2k+1)-th layer 55, $T_{2k+1}$ is equal to H+$T_1$. Accordingly, the twelfth embodiment meets the following relationship.

$$|T_3 - (H+T_1)| \leq 0.1\,\mu m$$

[Step 1260]

Thereafter, the polishing treatment is effected from the (2k+1=5)-th layer 55 to the second layer 52 to expose the first layer formed on the outermost position of the n-times overlapped stepped portions. This step may be carried out in the same way as [Step 640] of the sixth embodiment. FIG. 21C is a schematic partial cross-sectional view showing the body and the like upon completion of the polishing treatment.

A height $H_1$ of the first stepped portion is 0.15 µm. On the other hand, a height of the third layer 53 formed above the first stepped portion with reference to the surface of the body 10 which is the lowermost surface of the stepped portion is given as follows:

$$(H_1 + T_3) = 0.15\,\mu m + 0.30\,\mu m$$
$$= 0.45\,\mu m$$

Accordingly, with reference to the surface of the body 10 which is the lowermost surface of the stepped portion, the height of the fifth layer 55 formed above the bottom portion of the stepped portion and the height of the third layer 53 formed above the first stepped portion is equal to the height of the surface of the first layer on the top portion of the n-number of the stepped portions.

Therefore, when the polishing treatment is effected from the (2k+1)-th layer to the second layer 52 to expose the first layer 51 formed on the top portion of the n-number of stepped portions, not only do the first layer 51 formed on the top portion of the n-number of stepped portions and the fifth layer 55 formed above the bottom portion of the stepped portions serve as stoppers but also the third layer formed above the first stepped portion serves as a stopper. Accordingly, it is possible to further effectively suppress the excessive polishing of the forth layer 54 or the second layer 52.

Incidentally, the 2m'-th layer (where m'=1, 2, . . . , k+1, 2≦k) may be made of silicon nitride or a laminate of silicon oxide and silicon nitride. Also, the 2m-th layer may be made of polycrystalline silicon or a laminate of silicon oxide containing impurities and polycrystalline silicon.

Thus, an insulating multi-layer formed between the n-times overlapped stepped portions and whose surface is planarized by the lamination of the (2k+1) insulating layers is produced by the layer planarizing method in accordance with the twelfth embodiment. The first layer of the insulating multi-layer covers the top portion of the n-times overlapped stepped portions. On the other hand, a part of the surface of the insulating multi-layer above the bottom portion of the stepped portions is composed of the (2k+1)-th layer. The 2m-th layer (where m=1, 2, ..., k, $2 \leq k$) and the (2m+1)-th layer (where m=1, 2, ..., k−1, $2 \leq k$) are exposed between the first layer of the insulating layer which covers the top portion of the n-times overlapped stepped portions and the (2k+1)-th layer thereof. The 2m-th layer has a higher polishing rate than that of the (2m±1)-th layer. Furthermore, the (2k+1)-th layer has a higher polishing rate than that of the 2k-th layer.

Thirteenth Embodiment

A thirteenth embodiment is a modification of the twelfth embodiment. The thirteenth embodiment is different from the twelfth embodiment in thickness of the 2m-th layer (where m=1, 2, ..., k, $2 \leq k$).

Namely in the twelfth embodiment, assuming that k is equal to n, i.e., 2, $T_1$ is the thickness of the first layer on the top portion of the n-times overlapped stepped portions, and $H_1$ is the height of the i-th stepped portion (where i=1, 2, ..., n) from the lowermost portion of the n-times overlapped stepped portions, a height $T_{2j+1}$ from the bottom surface of the n-times overlapped stepped portions to the surface of the (2j+1)-th layer (where j=1, 2, ..., k−1, $2 \leq k$) is approximately the same as the value given as follows:

$$T_1 + \sum_{i=n-j+1}^{n} H_i$$

On the other hand, in the thirteenth embodiment, assuming that k is equal to n, i.e., 2, $T_1$ is the thickness of the first layer on the top portion of the n-times overlapped stepped portions, and $H_1$ is the height of the i-th stepped portion (where i=1, 2, ..., n) from the lowermost portion of the n-times overlapped stepped portions, a height $T_{2j+1}$ from the bottom surface of the n-times overlapped stepped portions to the surface of the (2j+1)-th layer (where j=1, 2, ..., k−1, $2 \leq k$) is approximately the same as $T_1 + H_j$.

The layer thickness from the first layer 51 to the fifth layer 55 is shown below.

| | |
|---|---|
| First layer 51: | 0.10 μm |
| Second layer 52: | 0.12 μm |
| Third layer 53: | 0.03 μm |
| Fourth layer 54: | 0.17 μm |
| Fifth layer 55: | 0.03 μm |

Each step of the layer planarizing method according to the thirteenth embodiment may be carried out in the same way as the twelfth embodiment and hence detailed explanation therefor will be omitted.

Also in the thirteenth embodiment, when the polishing treatment is effected from the (2k+1)-th layer to the second layer 52 to expose the first layer formed on the top portion of the n-number of stepped portions, not only do the first layer 51 formed on the top portion of the n-number of stepped portions and the fifth layer 55 formed above the bottom portion of the stepped portions serve as stoppers but also the third layer formed above the first stepped portion serves as a stopper. Accordingly, it is possible to further effectively suppress the excessive polishing of the forth layer 54 or the second layer 52.

Although the invention has been described based upon the embodiment, it is apparent that various details of the invention may be changed without departing from its spirit nor its scope. Furthermore, the foregoing description of the embodiments according to the present invention is provided for the purpose of illustration only, and not for the purpose of limiting the invention as defined by the appended claims and their equivalents. For example, the stepped portions may be formed by any other elements than the interconnections and isolation regions.

In the foregoing embodiments, the interconnections 14 and 50 are the gate electrodes of MOS type transistors or extensions of the gate electrodes. However, the interconnections 14 and 50 are not limited to those and it is possible to modify them in various manner as desired. Also, the bodys 10 are not limited to silicon semiconductor bodys. For instance, it is possible to form the bodys of chemical compound semiconductor bodys such as GaAs or the like. Furthermore, it is possible to use, as a body structure, a body 10 for a trench element isolation region formed in the silicon semiconductor body and an interconnection 14 formed in the trench element isolation region.

In the embodiments according to the first and second aspects of the invention, the number of the stages of the stepped portions is one or two but it is of course possible to use a larger number of stages. Also, in the embodiments according to the third aspect of the invention, the number of the stages of the stepped portions is two but it is possible to use any other number of stages. In the embodiments of the third aspect of the invention, k=n=2 is established for explanation but it is sufficient that n is one or more. Also, the value of k may be two or more and may be less than or greater than n. Which aspect should be used from the first, second and third aspects as the planarizing method may be determined on the basis of a shape or a height of the stepped portions and an interval between the stepped portions.

As described above, according to the planarizing method according to the present invention, since the polishing for planarization is carried out after laminating the first layer and the second layer having a lower polishing rate than that of the first layer or alternatively laminating layers having slow polishing rate and high polishing rate, the first layer formed on above the top portion of the stepped portion and/or the layers having the slow polishing rate serve as polishing stoppers. Accordingly, it is possible to control the polishing treatment of the second layer and/or other layers having the high polishing rate by the first layer and/or other layers having the slow polishing rate. It is therefore possible to effectively to prevent any local generation of corrugations on the layers of the body which have been polished. Consequently, it is possible to realize the layer planarization by the polishing treatment without uniformity. In addition, it is possible to enhance the controllability of the layer thickness because the first layer and the layers having the slow polishing rate are used as the polishing stoppers. Moreover, even if each layer would be excessively polished, it is possible to prevent it from being polished exceeding a predetermined layer thickness to thereby enhance the uniformity in polishing within the wafer surface.

As a result, it is possible to increase a margin of an exposure depth of focus upon the exposure in the photolithographic process. Also, since it is possible to reduce an amount of over-etching upon the formation of connection holes, it is possible to enhance reliability of interconnections. Also, upon the planarization of the trench element isolation region through the polishing method, it is possible to establish the compatibility of preventing any damage to the body and smoothing the surface of the body and the isolation regions. It is also possible to ensure the polishing treatment in which any reduction in thickness of the layers even in the wide element isolation regions (i.e., dishing) is not present. Accordingly, the yield of production of semiconductor devices is enhanced and the mass-production may readily be attained.

Also, in the planarizing method according to the second or third aspect of the invention, if the surface of the third layer formed above the bottom portion of the stepped portions or the (2k+1)-th layer thereof is set at a level in the range of ±1 μm relative to the surface of the first layer formed on the top portion of the stepped portions, it is possible to ensure a sufficient polishing allowance. Accordingly, it is possible to polish each surface substantially in a flat surface.

Furthermore, according to the present invention, by suitably selecting material that makes the 2m-th layer and the (2m±1)-th layer, it is possible to obtain a sufficient polishing rate relative to each layer.

What is claimed is:

1. A process for planarizing a surface of a semiconductor device, comprising the sequential steps of:

(a) forming at least two first and second overlapped stepped portions on a semiconductor body, said first and second stepped portions having an exposed vertical edge, said second stepped portion being formed only partially over said first stepped portion;

(b) covering, with a first layer, said first and second overlapped stepped portions and at least a portion of said semiconductor body;

(c) repeating (k−1) times the steps of forming on said first layer a 2m-th layer having a higher polishing rate than that of said first layer, where m is 1,2 ... k−1, and 2≦k, and subsequently forming on a 2m-th layer a (2m+1)-th layer having a lower polishing rate than that of said 2m-th layer;

(d) forming over the foregoing a 2k-th layer having a higher polishing rate than that of last 2m th+1 layer; and (e) polishing all of the layers until the first layer formed on an uppermost portion of said at least first and second overlapped stepped portions is exposed.

2. The process according to claim 1, wherein a value of $T_{2k}$ is greater than or substantially equal to $(H+T_1)$ where H is the height from the lowermost surface to the uppermost portion of at least two overlapped stepped portions, $T_1$ is the thickness of the first layer in the uppermost portion of at least two overlapped stepped portions, and $T_{2k}$ is the height from the lowermost surface of at least two overlapped stepped portions to the top surface of the 2k-th layer (2≦k).

3. The process according to claim 2, wherein a height $T_{2j+1}$ from the lowermost portion of at least two overlapped stepped portions to a surface of the (2j+1)-th layer (where j=1, 2, ..., k−1, 2≦k) is substantially represented by the following condition:

$$T_1 + \sum_{i=n-j+1}^{n} H_i$$

where k is equal to n, $T_1$ is the thickness of the first layer on the top portion of at least two overlapped stepped portions, and $H_1$ is the height of the i-th stepped portion (where i=1, 2, ..., n) from the lowermost portion of at least two overlapped stepped portions.

4. The process according to claim 1, wherein the 2m-th layer (where m=1, 2, ..., k, and 2≦k) comprises a laminate of at least one selected from the group consisting of silicon oxide containing impurities and polycrystalline silicon and the (2m−1)-th layer comprises a laminate of at least one selected from the group consisting of silicon oxide and silicon nitride.

5. The process according to claim 1, further comprising, between said step (d) and said step (e) the step of:

forming on the 2k-th layer the (2k+1)-th layer having a lower polishing rate than that of the 2k-th layer; and
   wherein said step (e) comprises the step of polishing the (2k+1)-th layer to the second layer.

6. The process according to claim 5, further satisfying the following condition:

$$|T_{2k+1}-(H+T_1)| \leq 0.1 \, \mu m$$

where H is the height from the lowermost surface to the uppermost portion at least two overlapped stepped portions, $T_1$ is the thickness of the first layer in the uppermost portion of at least two overlapped stepped portions, and $T_{2k+1}$ is the height from the lowermost surface of at least two overlapped stepped portions to the top surface of the (2k+1)-th layer.

7. The process according to claim 5, wherein a height $T_{2j+1}$ from the lowermost portion of at least two overlapped stepped portions to a surface of the (2j+1)-th layer (where j=1, 2, ..., k−1, 2≦k) is substantially represented by the following condition:

$$T_1 + \sum_{i=n-j+1}^{n} H_i$$

where k is equal to n, $T_1$ is the thickness of the first layer on the top portion of at least two overlapped stepped portions, and $H_1$ is the height of the i-th stepped portion (where i=1, 2, ..., n) from the lowermost portion of at least two overlapped stepped portions.

8. The process according to claim 5, wherein the (2m'−1)-th layer (where m'=1, 2, ..., k+1, and 2≦k) comprises a laminate of at least one selected from the group consisting of silicon oxide and silicon nitride and the 2m-th layer (where m=1, 2, ..., k, and 2≦k) comprises a laminate of at least one selected from the group consisting of silicon oxide containing impurities and polycrystalline silicon.

* * * * *